United States Patent
Saitou

(10) Patent No.: US 7,889,549 B2
(45) Date of Patent: Feb. 15, 2011

(54) NONVOLATILE SEMICONDUCTOR MEMORY AND DATA PROGRAMMING/ERASING METHOD

(75) Inventor: Tomoya Saitou, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 148 days.

(21) Appl. No.: 12/285,300

(22) Filed: Oct. 1, 2008

(65) Prior Publication Data
US 2009/0103355 A1 Apr. 23, 2009

(30) Foreign Application Priority Data
Oct. 19, 2007 (JP) .............................. 2007-272928

(51) Int. Cl.
*G11C 16/04* (2006.01)
(52) U.S. Cl. ............. 365/184; 365/185.05; 365/185.26; 365/185.28; 365/185.29
(58) Field of Classification Search ................. 365/184, 365/185.05, 185.26, 185.28, 185.29
See application file for complete search history.

(56) References Cited

U.S. PATENT DOCUMENTS

| | | | |
|---|---|---|---|
| 5,278,440 A | 1/1994 | Shimoji | |
| 6,255,166 B1 | 7/2001 | Ogura et al. | |
| 6,399,441 B1 | 6/2002 | Ogura et al. | |
| 6,809,374 B2 * | 10/2004 | Takamura | 257/324 |
| 7,130,221 B1 * | 10/2006 | Ho et al. | 365/185.18 |
| 2002/0045315 A1 | 4/2002 | Ogura et al. | |
| 2002/0131304 A1 * | 9/2002 | Ogura et al. | 365/185.28 |
| 2003/0032243 A1 * | 2/2003 | Ogura et al. | 438/257 |
| 2008/0239789 A1 * | 10/2008 | Shino et al. | 365/149 |
| 2010/0090257 A1 * | 4/2010 | Terai et al. | 257/255 |

FOREIGN PATENT DOCUMENTS

| | | |
|---|---|---|
| JP | 5-13776 | 1/1993 |
| JP | 2001-102466 | 4/2001 |
| JP | 2002-289711 | 10/2002 |
| JP | 2003-163292 | 6/2003 |
| JP | 2006-39778 | 2/2006 |

* cited by examiner

*Primary Examiner*—Connie C Yoha
(74) *Attorney, Agent, or Firm*—McGinn Intellectual Property Law Group, PLLC

(57) ABSTRACT

A nonvolatile semiconductor memory comprises: a semiconductor substrate; a first gate electrode formed on a surface of the semiconductor substrate through a first gate insulating film; a second gate electrode formed on the surface of the semiconductor substrate through a second gate insulating film and being adjacent to the first gate electrode through an insulating film; a charge trapping film formed at least in a trap region surrounded by the semiconductor substrate, the first gate electrode and the second gate electrode; and a tunnel insulating film formed between the charge trapping film and the second gate electrode. In one of programming and erasing, electrons are injected into the charge trapping film from the second gate electrode through the tunnel insulating film by Fowler-Nordheim tunneling.

20 Claims, 25 Drawing Sheets

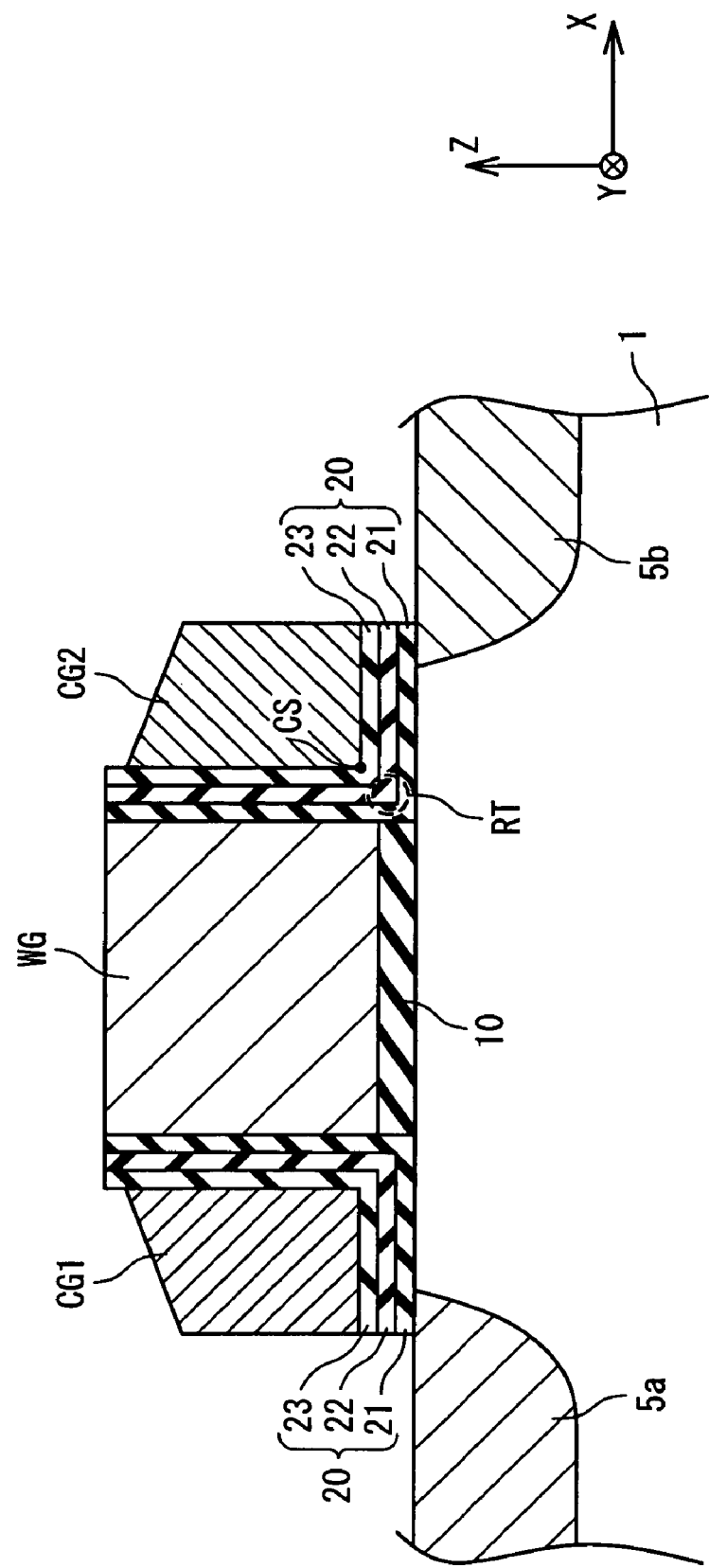

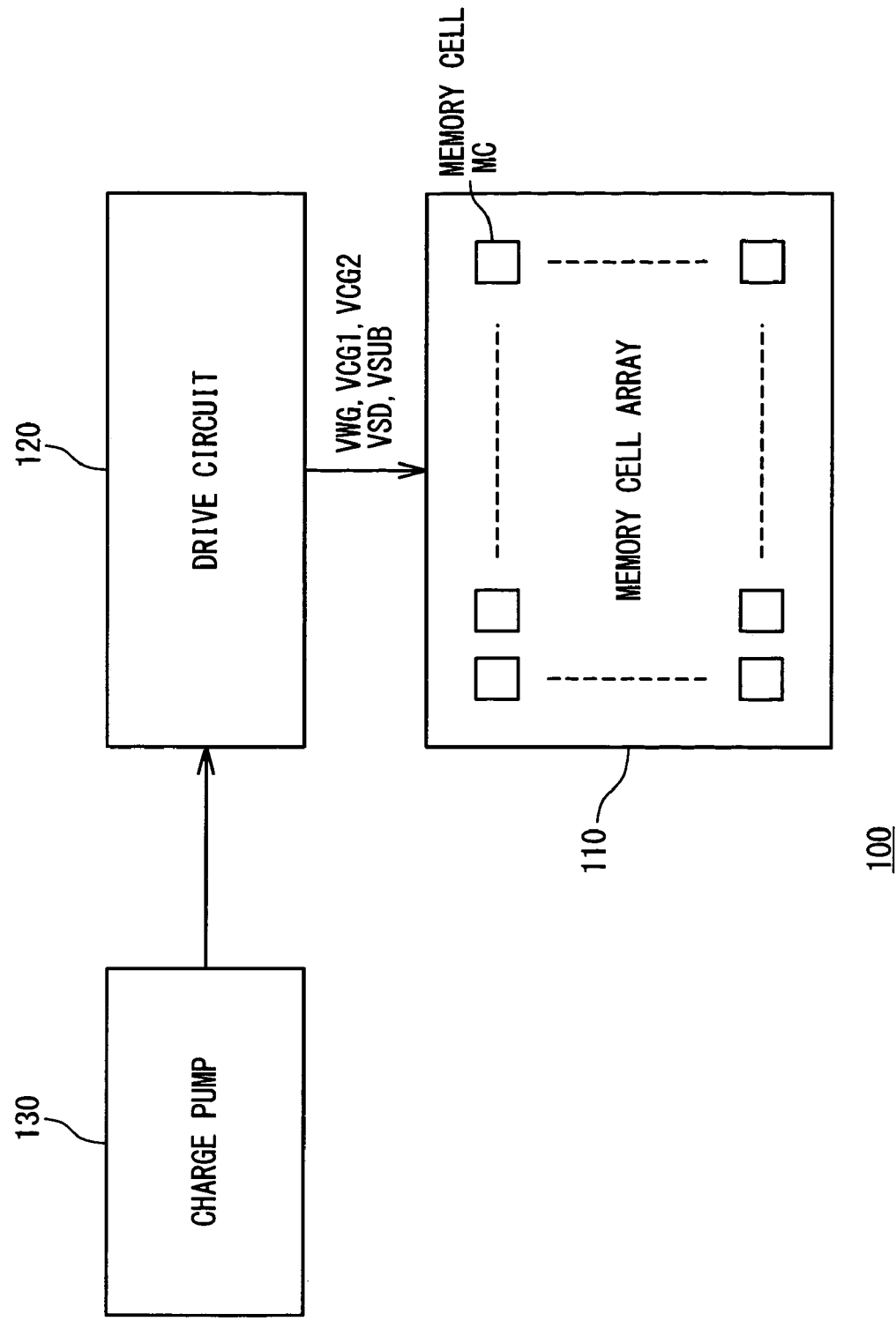

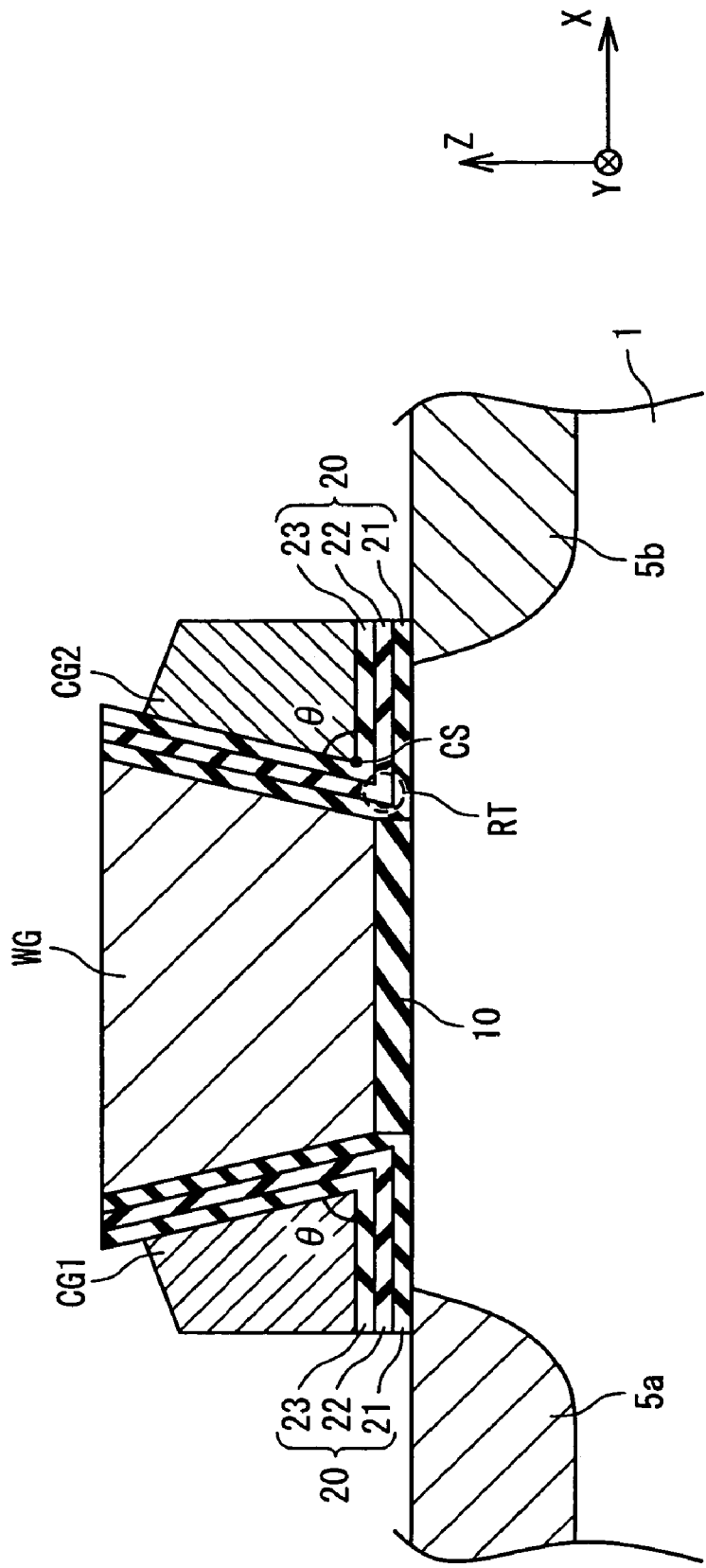

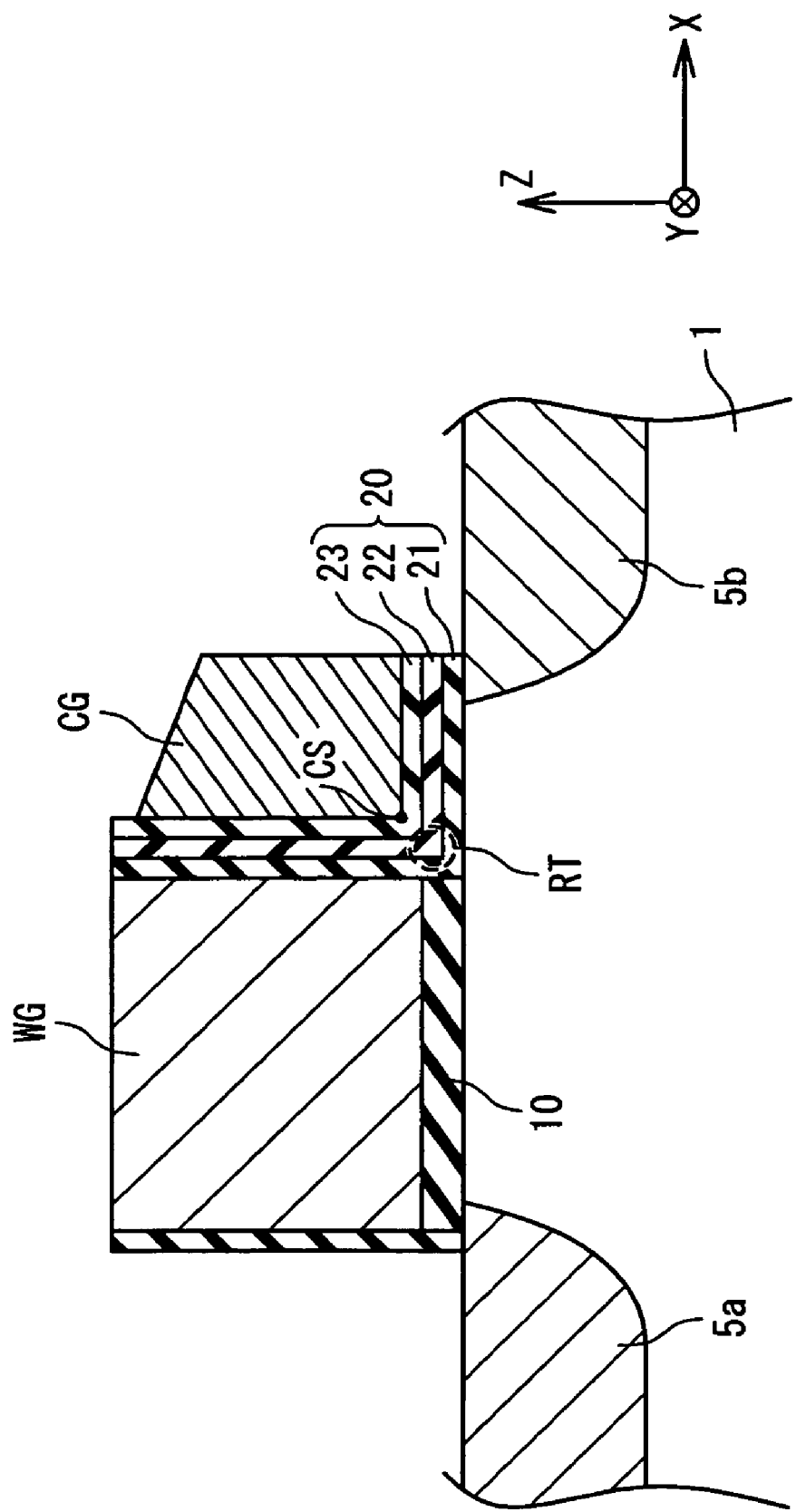

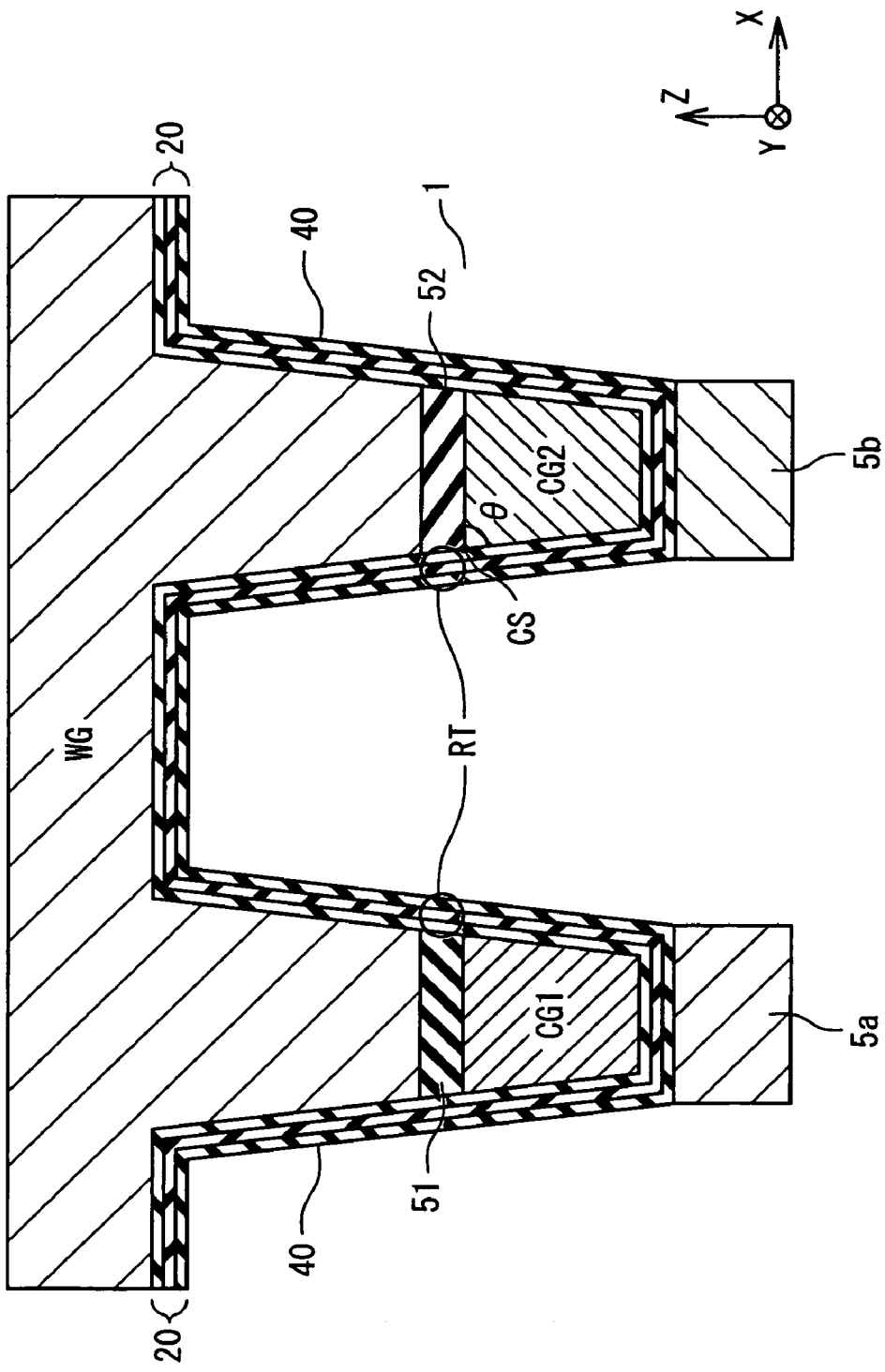

NONVOLATILE SEMICONDUCTOR MEMORY AND DATA PROGRAMMING/ERASING METHOD

INCORPORATION BY REFERENCE

This application is based upon and claims the benefit of priority from Japanese patent application No. 2007-272928, filed on Oct. 19, 2007, the disclosure of which is incorporated herein in its entirely by reference.

BACKGROUND OF THE INVENTION

1. Field of the Invention

The present invention relates to a nonvolatile semiconductor memory. In particular, the present invention relates to a charge-trapping type nonvolatile semiconductor memory and a data programming/erasing method for the charge-trapping type nonvolatile semiconductor memory.

2. Description of Related Art

A flash memory and a charge trapping memory are known as an electrically erasable and programmable nonvolatile semiconductor memory. The charge trapping memory among them stores data by using an element that can trap charges. For example, the element for trapping charges is a MONOS (Metal Oxide Nitride Oxide Silicon) transistor. The MONOS transistor is a kind of a MIS (Metal Insulator Silicon) transistor, and its gate insulating film is an ONO (Oxide Nitride Oxide) film formed by stacking a silicon oxide film, a silicon nitride film and a silicon oxide film in this order.

The silicon nitride film in the ONO film has a property of trapping charges. For example, it is possible to inject electrons into the silicon nitride film by applying appropriate voltages respectively to a gate electrode, source/drain and a substrate. In a case where electrons are trapped in the silicon nitride film, a threshold voltage of the MONOS transistor increases as compared with a case where electrons are not trapped. Conversely, the threshold voltage decreases when trapped electrons are ejected from the silicon nitride film. By utilizing such change in the threshold voltage, the MONOS transistor can nonvolatilely store data "1" and "0". That is to say, the charge trapping memory stores data by using the MONOS transistor as a memory cell.

The followings are known as techniques related to the charge trapping memory.

According to a charge trapping memory described in Japanese Laid Open Patent Application JP-H-05-13776 (Patent Document 1), a surface of a channel region of a MNOS transistor is formed to be convex. When a voltage is applied between a gate electrode and the channel region, an electric field is intensified at the convex section. As a result, a voltage at the time of programming/erasing can be reduced.

Japanese Laid Open Patent Applications JP-2002-289711 (Patent Document 2), JP-2003-163292 (Patent Document 3) and JP-2001-102466 (Patent Document 4) each disclose a charge trapping memory that uses a memory cell transistor having a plurality of gate electrodes. Typically, the memory cell transistor has one word gate and two control gates provided on both sides of the word gate. An ONO film is formed between each control gate and a semiconductor substrate. In this case, one memory cell is capable of storing 2-bit data. The charge trapping memory having such a structure is also referred to as a "twin-MONOS-type memory".

According to the above-mentioned Patent Document 4 (JP-2001-102466), the electron injection into the silicon nitride film is performed by "CHE (Channel Hot Electron) method". That is, channel hot electrons generated in the vicinity of a drain in the semiconductor substrate are injected into the silicon nitride film from the semiconductor substrate side. On the other hand, the electron ejection from the silicon nitride film is performed by "FN (Fowler-Nordheim) tunneling method". Here, electrons are ejected from the silicon nitride film to the control gate side by the FN tunneling.

In either case of the CHE method and the FN tunneling method, a predetermined voltage needs to be applied to the control gate. In general, an absolute value of the applied voltage is larger in the case of the FN tunneling method than in the case of the CHE method. In the case of the FN tunneling method, the applied voltage is comparatively high and thus a breakdown voltage required for the memory cell transistor is also comparatively high. This causes increase in the element size.

The inventor of the present application has recognized the following points. That is a fact that a greater amount of current is required in the CHE method than in the FN tunneling method. More specifically, the amount of current is several tens pA (picoampere) in the case of the FN tunneling method, while it is several hundreds µA (microampere) in the case of the CHE method.

In the case of the CHE method, the channel is conducting and the current flows between the drain and the source. Then, only a part of electrons of the current is stochastically injected into the silicon nitride film, and the remaining electrons are drawn into the drain. In the case of the FN tunneling method, on the other hand, the channel is not conducting and a current does not flow between the drain and the source. Electrons are transferred to or from the silicon nitride film through a tunnel insulating film, and only an FN tunnel current associated with the electron transfer flows. As an example, let us consider injection of the same amount of electrons into the silicon nitride film. In this case, an extra current that does not contribute to the electron injection is necessary according to the CHE method, as compared with the FN tunneling method. It can be said that an efficiency of the electron injection with respect to the necessary current is worse in the CHE method than in the FN tunneling method.

As described above, the CHE method requires a large amount of current, which leads to increase in current consumption. Accordingly, a technique is desired which can reduce the current consumption with suppressing the increase in the element size.

SUMMARY

In one embodiment of the present invention, a nonvolatile semiconductor memory comprises a semiconductor substrate, a first gate electrode, a second gate electrode, a charge trapping film and a tunnel insulating film. The first gate electrode is formed on a surface of the semiconductor substrate through a first gate insulating film. The second gate electrode is formed on the surface of the semiconductor substrate through a second gate insulating film and is adjacent to the first gate electrode through an insulating film. The charge trapping film is an insulating film that traps charges and is formed at least in a trap region surrounded by the semiconductor substrate, the first gate electrode and the second gate electrode. The tunnel insulating film is formed between the charge trapping film and the second gate electrode.

The inventor of the present application has found that "electric field concentration" is generated in the above-mentioned trap region by applying predetermined voltages respectively to the semiconductor substrate, the first gate electrode and the second gate electrode. More specifically, the electric field concentration is generated in the trap region on the second gate electrode side, namely, in and around the above-mentioned tunnel insulating film formed between the charge trapping film and the second gate electrode. The FN tunneling method utilizing the electric field concentration enables at least an efficient electron injection from the "second gate electrode" into the charge trapping film. According to the present invention, electrons are injected into the charge trapping film from the second gate electrode through the tunnel insulating film by the FN tunneling, in data programming or data erasing.

In the case of the FN tunneling by the use of the electric field concentration, an efficiency of the electron injection is improved as compared with the conventional FN tunneling. Therefore, the applied voltage can be designed to be smaller. To put it the other way around, the electron injection can be well achieved even if the applied voltage is set to be comparatively small, because the electric field concentration is generated. When the applied voltage is reduced, the breakdown voltage required for the memory cell transistor also becomes smaller, which can reduce the element size. In other words, according to the present invention, the increase in the element size is suppressed although the FN tunneling method is adopted.

Moreover, according to the present invention, the CHE method is not adopted for the electron injection. Instead, the FN tunneling method is adopted for the electron injection. Therefore, the current consumption is reduced as compared with the case where the CHE method is used.

According to the present invention, as described above, it is possible in the charge trapping memory to reduce the current consumption with suppressing the increase in the element size.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1 is a cross-sectional view showing a structure of a nonvolatile semiconductor memory according to a first embodiment;

FIG. 11 is a block diagram showing an example of a semiconductor integrated circuit provided with the nonvolatile semiconductor memory;

FIG. 15 is a cross-sectional view showing a structure of a nonvolatile semiconductor memory according to a second embodiment;

FIG. 19 is a cross-sectional view showing a structure of a nonvolatile semiconductor memory according to a fourth embodiment;

FIG. 21 is a cross-sectional view showing a structure of a nonvolatile semiconductor memory according to a fifth embodiment.

DETAILED DESCRIPTION OF PREFERRED EMBODIMENTS

Figure 2A:
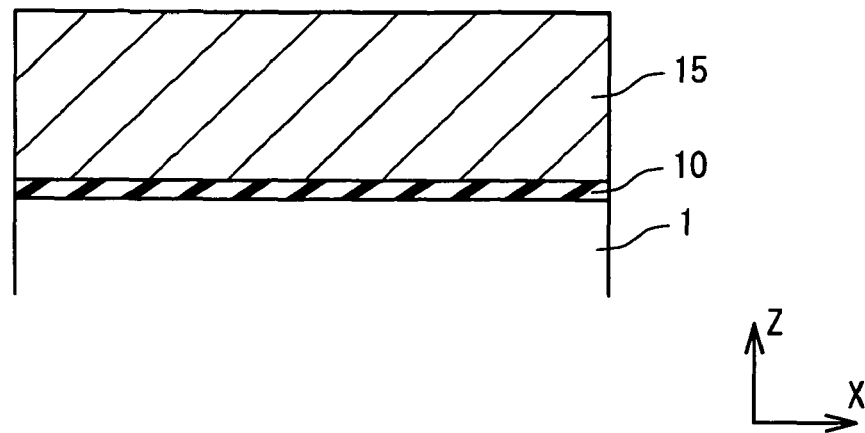
FIG. 2A is a cross-sectional view showing a manufacturing process of the structure shown in FIG. 1.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A nonvolatile semiconductor memory according to embodiments of the present invention will be described with reference to the attached drawings. The nonvolatile semiconductor memory according to the embodiments is a charge trapping memory that uses a memory cell transistor having a plurality of gate electrodes.

1. First Embodiment

1-1. Cell Structure

FIG. 1 is a cross-sectional view showing a structure of a nonvolatile semiconductor memory according to a first embodiment. In particular, FIG. 1 shows a cross-sectional structure of a memory cell transistor. The memory cell transistor according to the present embodiment will be described below with reference to FIG. 1.

Diffusion regions 5a and 5b which serve as source/drain are formed in a semiconductor substrate 1. For example, the semiconductor substrate 1 is a P-type silicon substrate (P-type well) and the diffusion regions 5a and 5b are N-type diffusion regions. A semiconductor region between the diffusion regions 5a and 5b is a channel region and the channel direction is the X-direction. A plurality of gate electrodes (WG, CG1, CG2) are provided over the channel region. The gate electrodes (WG, CG1, CG2) extend in the Y-direction perpendicular to the X-direction.

More specifically, the plurality of gate electrodes are a word gate WG and two control gates CG1 and CG2 provided on both sides of the word gate WG. The word gate WG is formed on a surface of the semiconductor substrate 1 through a first gate insulating film 10. Each of the control gates CG1 and CG2 is formed on the surface of the semiconductor substrate 1 through a second gate insulating film 20. In the following description, each of the control gates CG1 and CG2 may be referred to as merely a "control gate CG". The control gate CG is adjacent to the word gate WG through an insulating film. That is to say, the word gate WG and the control gate CG are close to each other but electrically isolated from each other. In FIG. 1, the second gate insulating film 20 extends from between the semiconductor substrate 1 and the control gate CG to between the word gate WG and the control gate CG.

The second gate insulating film 20 includes a bottom insulating film 21, a charge trapping film 22 and a top insulating film 23. The bottom insulating film 21 is an insulating film on the side of the semiconductor substrate 1 and is formed between the charge trapping film 22 and the semiconductor substrate 1. On the other hand, the top insulating film 23 is an insulating film on the side of the control gate CG and is formed between the charge trapping film 22 and the control gate CG. The charge trapping film 22 is an insulating film having a property of trapping charges and is sandwiched between the bottom insulating film 21 and the top insulating film 23. The second gate insulating film 20 is, for example, an ONO film. In this case, the bottom insulating film 21, the charge trapping film 22 and the top insulating film 23 are a silicon oxide film, a silicon nitride film and a silicon oxide film, respectively.

In FIG. 1, there is a region RT surrounded by the semiconductor substrate 1, the word gate WG and the control gate CG. The region RT corresponds to a corner section of the second gate insulating film 20. Also, the control gate CG has an edge section CS facing the region RT. The edge section CS is one of edges of a bottom part of the control gate CG and is located at the opposite side of the diffusion region 5. The above-mentioned region RT and the edge section CS of the control gate CG face each other. According to the present embodiment, as described later, charge transfer is intensively performed between the edge section CS of the control gate CG and the charge trapping film 22 within the region RT. That is, charges are concentratively trapped by the charge trapping film 22 within the region RT. In that sense, the region RT is hereinafter referred to as a "trap region RT".

Charges are concentratively trapped in the charge trapping film 22 in the trap region RT. For this reason, the charge trapping film 22 is formed at least in the trap region RT. From a viewpoint of manufacturing, it is preferable to form the second gate insulating film 20 including the charge trapping film 22 throughout a region from between the semiconductor substrate 1 and the control gate CG to the trap region RT. In the example shown in FIG. 1, the second gate insulating film 20 including the charge trapping film 22 extends from between the semiconductor substrate 1 and the control gate CG through the trap region RT to between the word gate WG and the control gate CG. In other words, the second gate insulating film 20 has an "L-shape" in the XZ-plane perpendicular to the Y-direction.

The above-described control gate CG, second gate insulating film 20 and charge trapping film 22 are formed on both sides of the word gate WG. That is to say, the memory cell transistor shown in FIG. 1 has a "twin MOMOS structure" including a MONOS transistor on the side of the control gate CG1 and another MONOS transistor on the side of the control gate CG2. In each MONOS transistor, its threshold voltage increases when electrons are injected into the charge trapping film 22 while decreases when electrons are ejected from the charge trapping film 22. By utilizing such a change in the threshold voltage, each MONOS transistor nonvolatilely stores data "1" and "0". The memory cell transistor shown in FIG. 1 can store 2-bit data.

1-2. Manufacturing Method

Next, an example of a manufacturing process of the structure shown in FIG. 1 will be described with reference to FIGS. 2A to 2G.

In FIG. 2A, the semiconductor substrate 1 is a P-type silicon substrate, for example. After a device isolation structure such as an STI (Shallow Trench Isolation) structure is formed in the semiconductor substrate 1, the first gate insulating film 10 is formed on the semiconductor substrate 1. For example, the first gate insulating film 10 is a silicon oxide film that is formed by a thermal oxidation method. Subsequently, a first polysilicon film 15 is deposited on the first gate insulating film 10 by a CVD (Chemical Vapor Deposition) method. The first polysilicon film 15 is a material for the word gate WG.

Figure 2B:
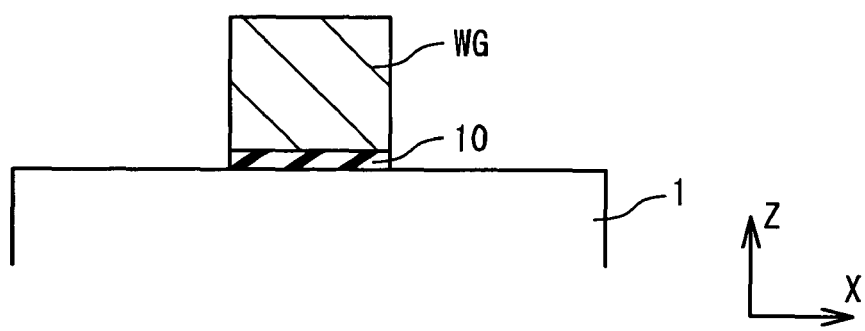
FIG. 2B is a cross-sectional view showing the manufacturing process of the structure shown in FIG. 1.

Next, a resist mask is formed in a predetermined region where the word gate WG is to be formed. The first polysilicon film 15 and the first gate insulating film 10 are etched by the use of the resist mask. Consequently, the word gate WG is formed on the semiconductor substrate 1 in the predetermined region through the first gate insulating film 10, as shown in FIG. 2B.

Figure 2C:
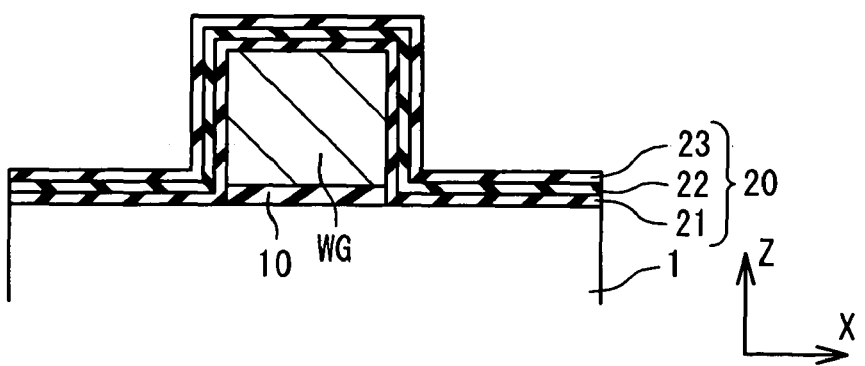
FIG. 2C is a cross-sectional view showing the manufacturing process of the structure shown in FIG. 1.

Next, as shown in FIG. 2C, the bottom insulating film 21, the charge trapping film 22 and the top insulating film 23 are formed in this order. For example, the bottom insulating film 21 is a silicon oxide film formed by the thermal oxidation method, the charge trapping film 22 is a silicon nitride film formed by the CVD method, and the top insulating film 23 is a silicon oxide film formed by the CVD method. Thereby, an ONO film is formed as the second gate insulating film 20.

Figure 2D:
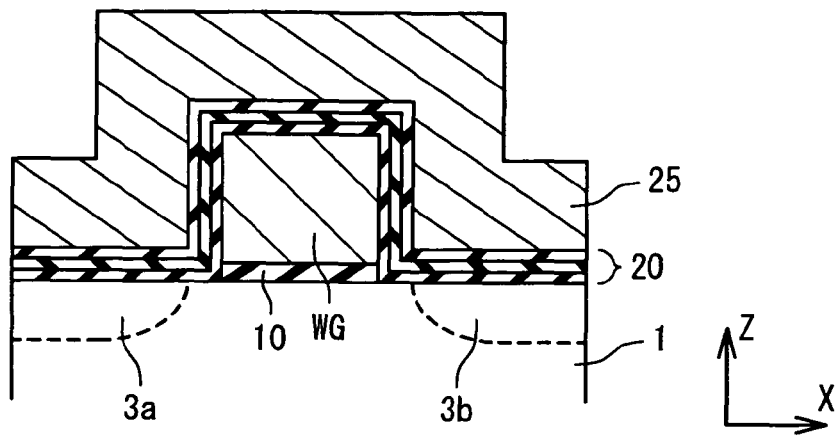
FIG. 2D is a cross-sectional view showing the manufacturing process of the structure shown in FIG. 1.

Next, impurity ions are injected into the semiconductor substrate 1 under a region where the control gate CG is to be formed, and thereby ion injection regions 3a and 3b are formed as shown in FIG. 2D. The ion injection regions 3a and 3b are formed in order to adjust the threshold voltages of the respective MONOS transistors. Subsequently, a second polysilicon film 25 is blanket deposited over the second gate insulating film 20 by the CVD method. The second polysilicon film 25 is a material for the control gate CG.

Figure 2E:
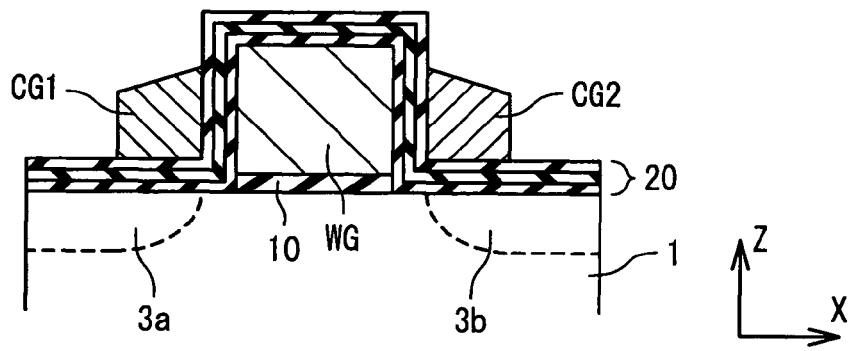
FIG. 2E is a cross-sectional view showing the manufacturing process of the structure shown in FIG. 1.

Next, the second polysilicon film 25 is etched back. As a result, the control gates CG1 and CG2 are formed on both sides of the word gate WG, as shown in FIG. 2E.

Figure 2F:
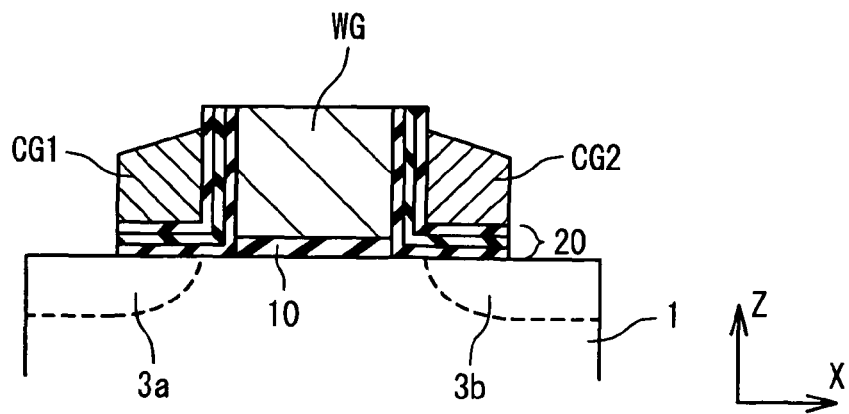
FIG. 2F is a cross-sectional view showing the manufacturing process of the structure shown in FIG. 1.

Next, the second gate insulating film 20 is etched until the word gate WG and semiconductor substrate 1 are exposed. Consequently, as shown in FIG. 2F, the second gate insulating films 20 with the L-shape are formed on both sides of the word gate WG. Each of the second gate insulating films 20 is located between the semiconductor substrate 1 and the control gate CG and between the word gate WG and the control gate CG.

Figure 2G:
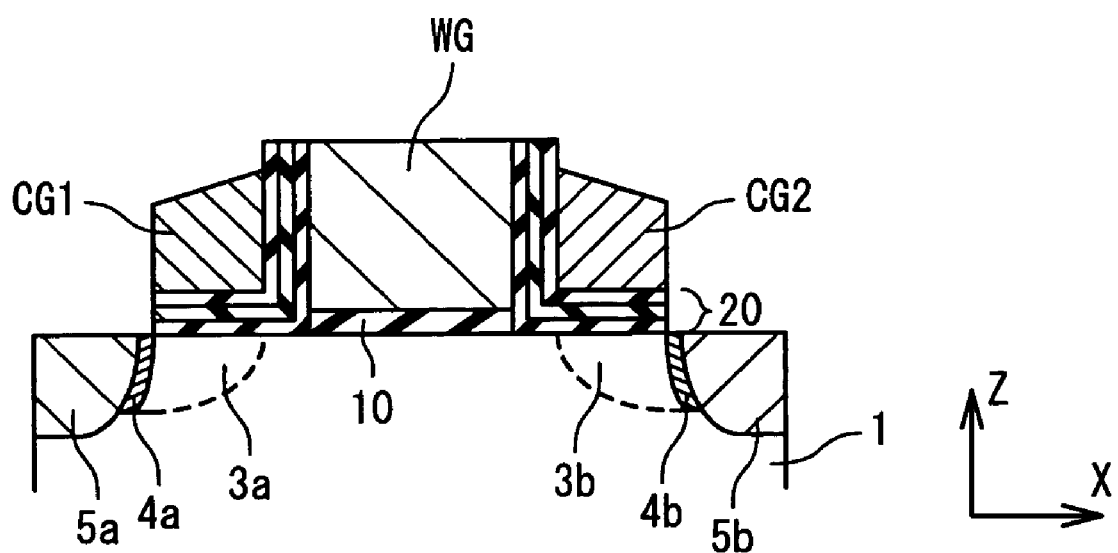
FIG. 2G is a cross-sectional view showing the manufacturing process of the structure shown in FIG. 1.

Next, an ion injection process is performed so that LDD injection regions 4a and 4b are formed near the surface of the semiconductor substrate 1, as shown in FIG. 2G. Furthermore, a side wall is formed on a side surface of the control gate CG and then another ion injection process is performed. As a result, the diffusion regions 5a and 5b which serve as the source/drain of the memory cell transistor are formed in the semiconductor substrate 1. In the ion injection processes, N-type impurities such as arsenic are injected for example.

In this manner, the memory cell transistor shown in FIG. 1 can be manufactured.

1-3. Data Programming/Data Erasing

Next, data programming/erasing for the memory cell transistor shown in FIG. 1 will be described below. The threshold voltage increases when electrons are injected into the charge trapping film 22, and the threshold voltage decreases when electrons are ejected from the charge trapping film 22. In the present embodiment, the electron injection is related to "data erasing", and the electron ejection is related to "data programming". The correspondence relationship can be opposite. The programming is an operation for changing the threshold voltage of one bit. The erasing is an operation for collectively changing the threshold voltages of a set of bits within a certain selected block.

According to the present embodiment, the "FN tunneling method" instead of the CHE method is adopted in the electron injection. That is, at least the electron injection (data erasing) is performed based on the FN tunneling method. As described later, the electron injection into the charge trapping film 22 occurs not on the side of the semiconductor substrate 1 but on the side of the control gate CG. In other words, the electron injection is achieved by FN tunneling between the control gate CG and the charge trapping film 22 through the top insulating film 23. In that sense, the top insulating film 23 may be referred to as a "tunnel insulating film" hereinafter.

(Electron Injection: Erasing)

Figure 3:
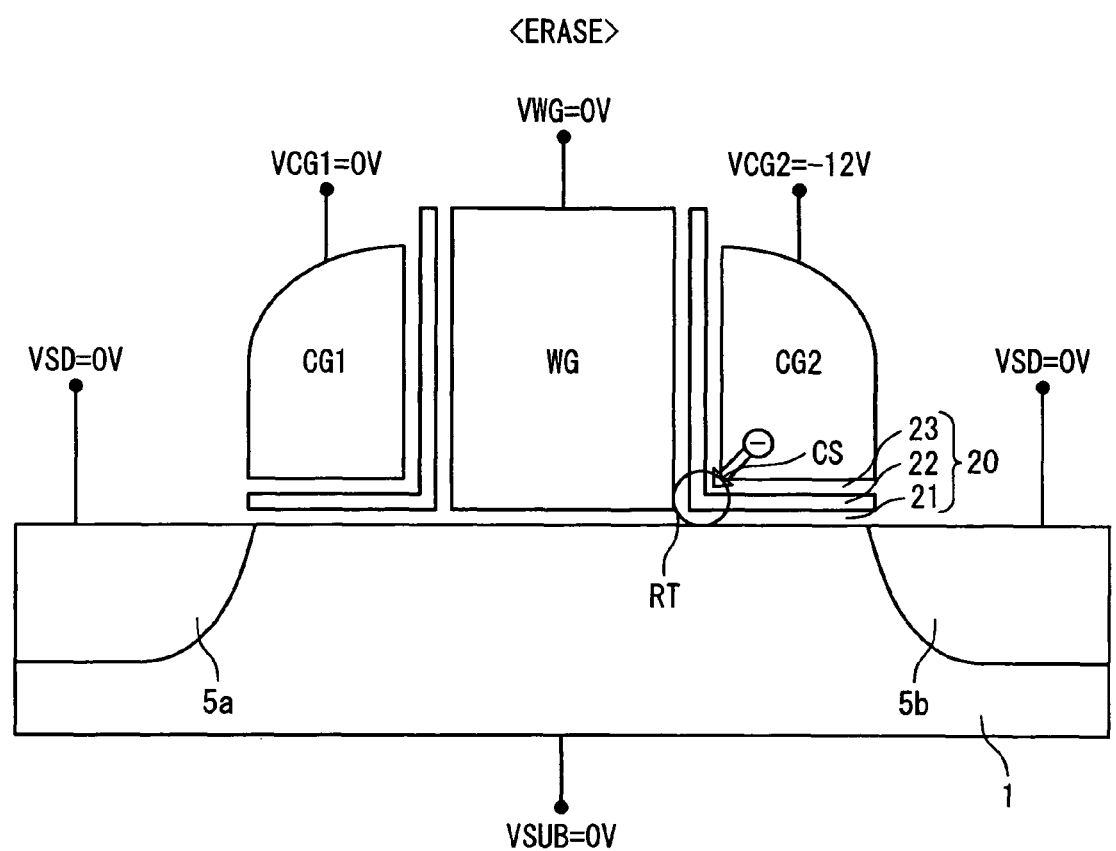
FIG. 3 is a schematic diagram for describing electron injection.

FIG. 3 is a schematic diagram showing the electron injection (data erasing) according to the present embodiment. Let us consider a case where the erasure target is a bit on the side of the control gate CG2. That is, the bit on the side of the control gate CG2 is a selected bit, and the other bit on the side of the control gate CG1 is an unselected bit.

A gate voltage VWG (=0 V) is applied to the word gate WG. A substrate voltage VSUB (=0 V) is applied to the semiconductor substrate 1. A voltage VSD (=0 V) is applied to the diffusion regions 5a and 5b. The applied voltages VWG, CG1 (=0 V) isVSUB and VSD are the same 0V. Also, a gate voltage V applied to the control gate CG1 on the unselected side. At this time, a gate voltage VCG2 (=−12 V) lower than 0 V is applied to the control gate CG2 on the selected side. Due to the voltage application, an electric field is generated between the control gate CG2 and the semiconductor substrate 1 and between the control gate CG2 and the word gate WG. The electric field is applied to the second gate insulating film 20, and thereby the FN tunneling occurs.

Figure 4:
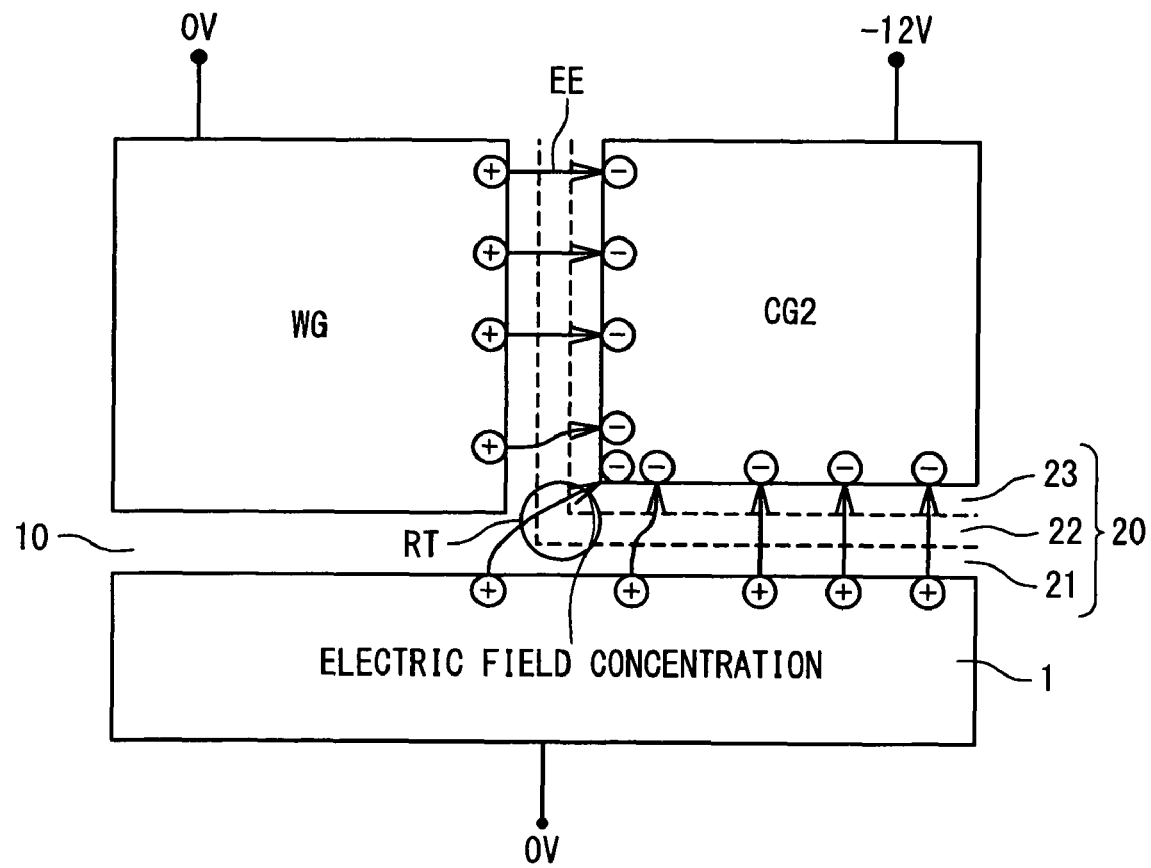
FIG. 4 is a schematic diagram for describing electric field concentration at the time of the electron injection.
Figure 5:
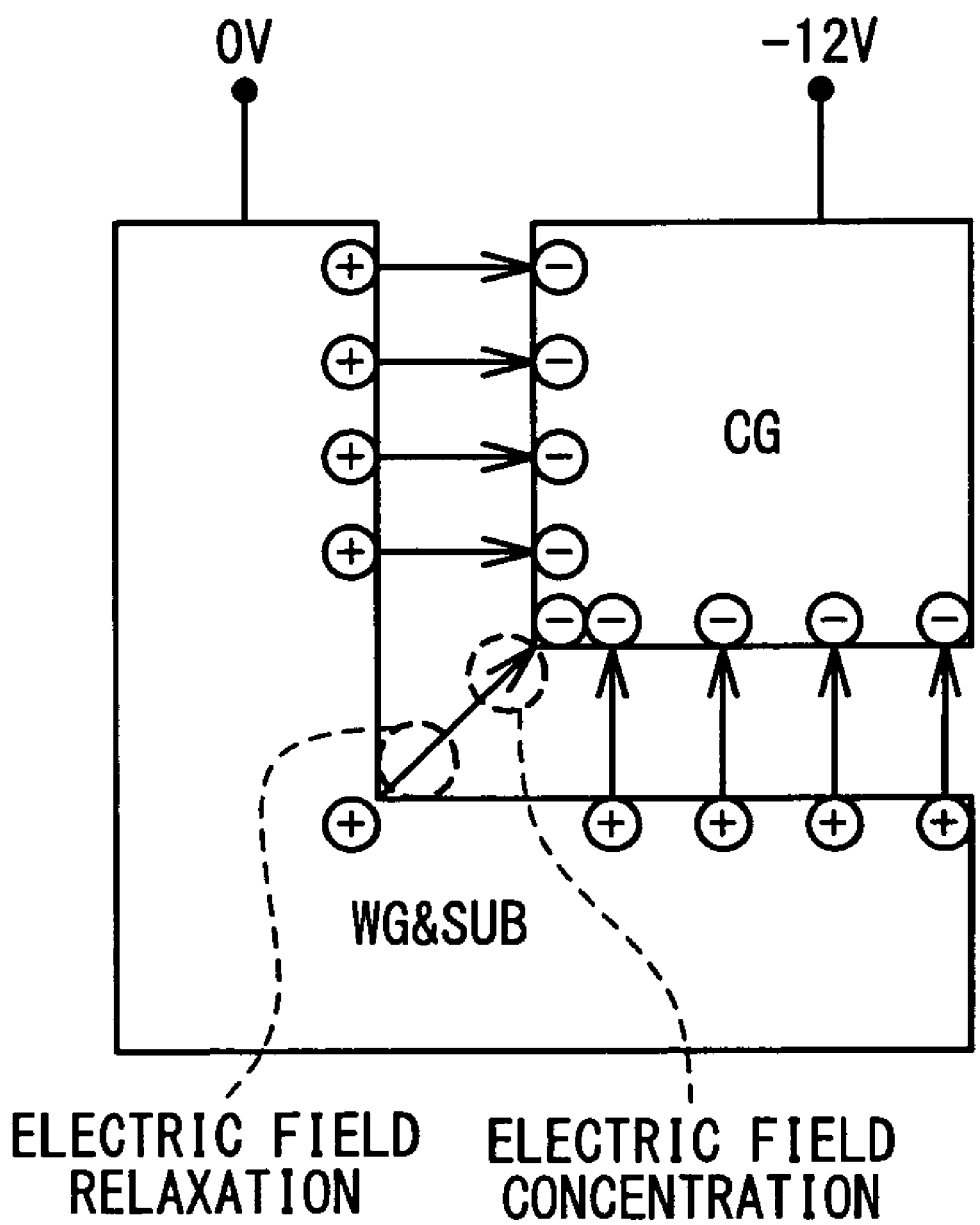
FIG. 5 is a schematic diagram for describing electric field concentration at the time of the electron injection.

FIG. 4 schematically shows a state of the electric field at this time. As described above, the voltage of 0 V is applied to the word gate WG and the semiconductor substrate 1, while the voltage of −12 V is applied to the control gate CG2. This state can be described by making an analogy to an L-shaped capacitor shown in FIG. 5. The control gate CG2 serves as one electrode of the L-shaped capacitor. The word gate WG and the semiconductor substrate 1 as a whole can be approximately regarded as the other electrode, although the thin first gate insulating film 10 exists between the word gate WG and the semiconductor substrate 1. Thus, charges with the opposite polarities appear on respective surfaces of the two facing electrodes of the L-shaped capacitor. In FIGS. 4 and 5, negative charges appear on the surface of the control gate CG2, while positive charges appear on the surfaces of the word gate WG and the semiconductor substrate 1. In this case, an "erase electric field EE" directed from the surfaces of the word gate WG and the semiconductor substrate 1 toward the surface of the control gate CG2 is generated.

With regard to the erase electric field EE, as shown in FIG. 5, "electric field concentration" occurs-on the side of the control gate CG having the smaller surface area, while "electric field relaxation" occurs on the other side having the larger surface area. In the case of the L-shaped capacitor, it is a corner section of the L-shape where a difference between the surface areas is conspicuous. Therefore, the electric field concentration and electric field relaxation occur especially at the corner section.

Referring to FIG. 4 again, the above-mentioned trap region RT corresponds to the corner section. Thus, the concentration and relaxation of the erase electric field EE occurs especially in the trap region RT in the second gate insulating film 20. More specifically, the "electric field concentration" is generated on the side of the control gate CG2, namely, in and around the top insulating film 23 in the trap region RT. Conversely, the "electric field relaxation" is generated on the side of the semiconductor substrate 1, namely, in and around the bottom insulating film 21 in the trap region RT. In this manner, the erase electric field EE becomes stronger in and around the top insulating film 23 in the trap region RT while becomes weaker in and around the bottom insulating film 21 in the trap region RT. Therefore, the FN tunneling is most likely to occur through the top insulating film 23 in the trap region RT. Conversely, the FN tunneling is least likely to occur through the bottom insulating film 21 in the trap region RT.

Thus, as shown in FIG. 3, the electron injection into the charge trapping film 22 is mainly performed from the side of the control gate CG2, not from the side of the semiconductor substrate 1. Due to the FN tunneling, electrons are injected into the charge trapping film 22 from the control gate CG2 through the top insulating film (tunnel insulating film) 23. In particular, due to the electric field concentration on the edge section CS of the control gate CG2, electrons are intensively injected from near the edge section CS into the charge trapping film 22 facing the edge section CS. As a result, electrons are concentratively trapped in the charge trapping film 22 in the trap region RT.

Figure 6:
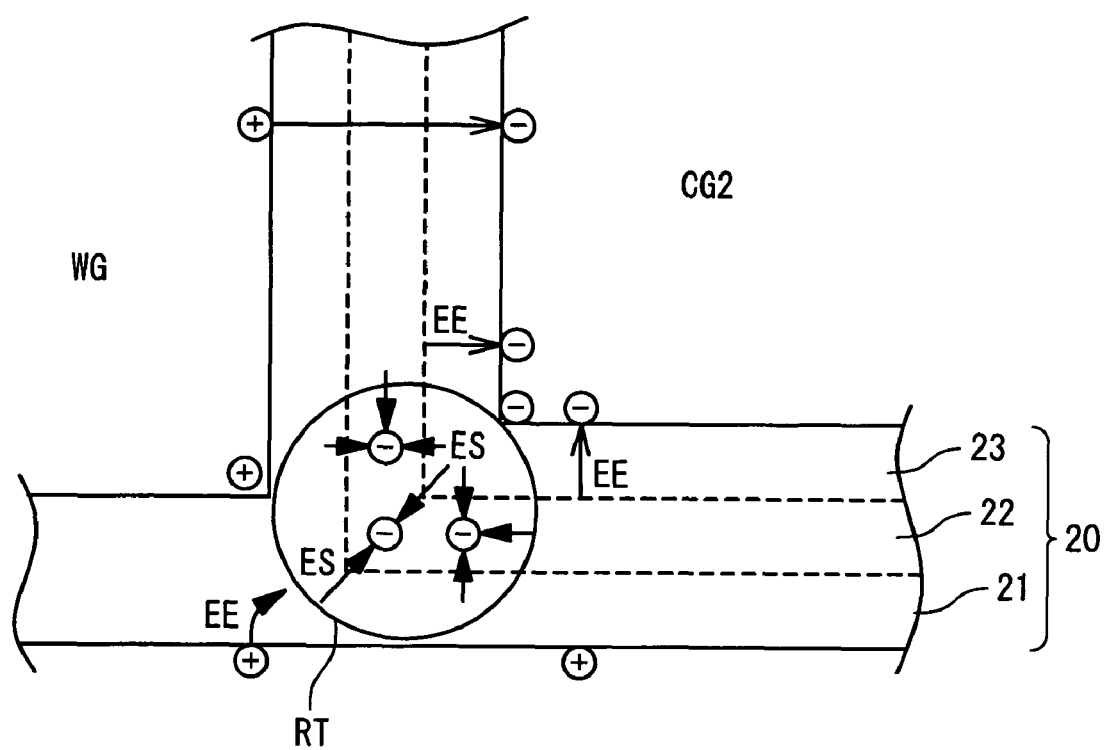
FIG. 6 is a schematic diagram for describing an action of a self electric field at the time of the electron injection.

FIG. 6 shows a state after a certain amount of electrons is injected into the charge trapping film 22. As shown in FIG. 6, an electron group is concentratively trapped in the charge trapping film 22 within the trap region RT. A self electric field ES is generated from the trapped electron group. A direction of the self electric field ES is toward the inside of the trap region RT. Accordingly, the self electric field ES works so as to weaken the erase electric field EE on the side of the top insulating film 23 and strengthen the erase electric field EE on the side of the bottom insulating film 21. In other words, the electric field concentration and electric field relaxation both are suppressed by superposition of the erase electric field EE and the self electric field ES. Thus, the electron injection does not continue unlimitedly, and the electron injection into the trap region RT hardly occurs after a certain amount of electrons is trapped. This means that the amount of the injected electrons becomes equivalent to some extent depending on the erase voltage.

According to the present embodiment, as described above, the electric field concentration on the edge section CS of the control gate CG2 is generated and thus electrons are mainly injected from the control gate CG2 into the charge trapping film 22 through the top insulating film 23. In the case of the FN tunneling by the use of the electric field concentration, an efficiency of the electron injection is improved as compared with the conventional FN tunneling. Therefore, the applied voltage can be designed to be smaller. To put it the other way around, the electron injection can be well achieved due to the electric field concentration, even if the applied voltage is set to be comparatively small. When the applied voltage is reduced, the breakdown voltage required for the memory cell transistor also becomes smaller, which can reduce the element size. In other words, the increase in the element size is suppressed although the FN tunneling method is adopted according to the present embodiment.

(Electron Ejection: Programming)

As in the case of the above-described electron injection, the electron ejection (programming) also can be performed by FN tunneling between the control gate CG and the charge trapping film 22. In this case, both of the electron injection (erasing) and electron ejection (programming) occur by the FN tunneling not on the side of the semiconductor substrate 1 but on the side of the control gate CG.

Figure 7:
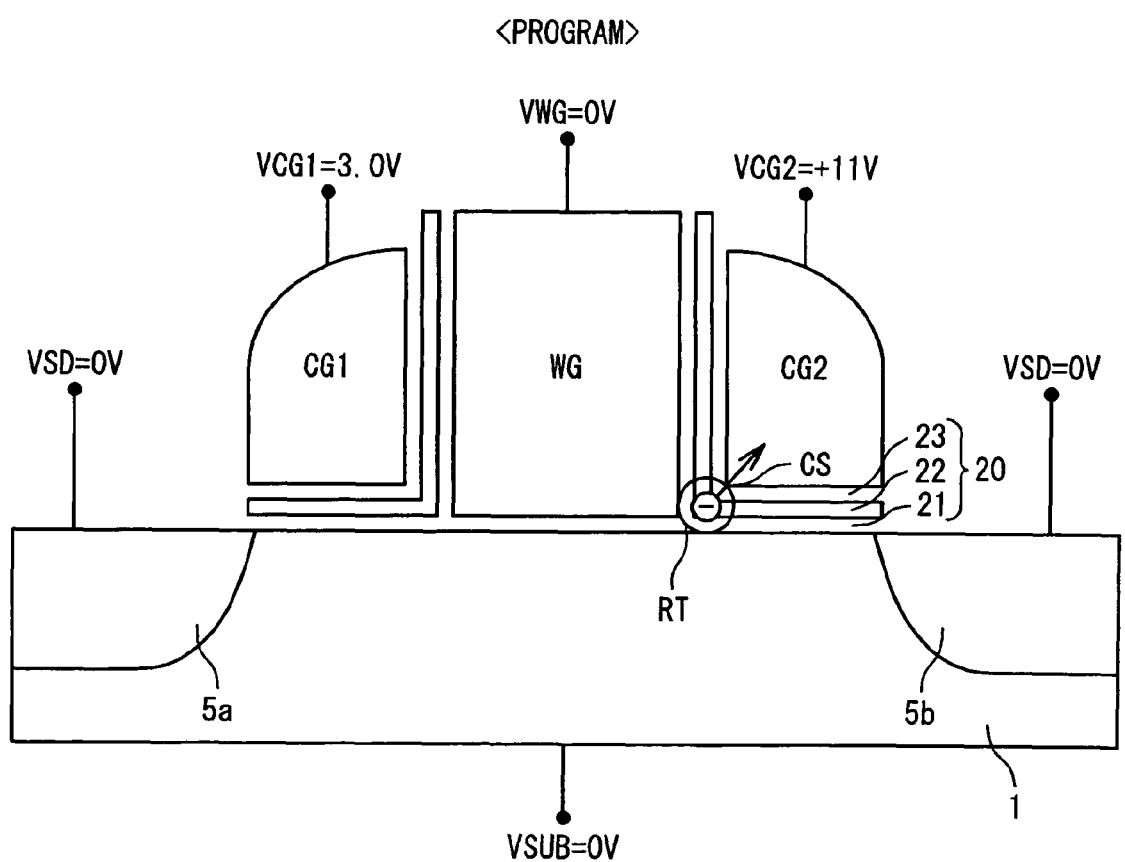
FIG. 7 is a schematic diagram for describing electron ejection.

FIG. 7 is a schematic diagram showing the electron ejection (data programming) according to the present embodiment. Let us consider a case where the program target is a bit on the side of the control gate CG2. That is, the bit on the side of the control gate CG2 is a selected bit, and the other bit on the side of the control gate CG1 is an unselected bit.

A gate voltage VWG (=0 V) is applied to the word gate WG. A substrate voltage VSUB (=0 V) is applied to the semiconductor substrate 1. A voltage VSD (=0 V) is applied to the diffusion regions 5a and 5b. The applied voltages VWG, VSUB and VSD are the same 0V. A gate voltage VCG1 (=+3 V) is applied to the control gate CG1 on the unselected side. At this time, a gate voltage VCG2 (=+11 V) higher than 0 V is applied to the control gate CG2 on the selected side. Due to the voltage application, an electric field is applied to the second gate insulating film 20, and thereby the FN tunneling occurs.

Figure 8:
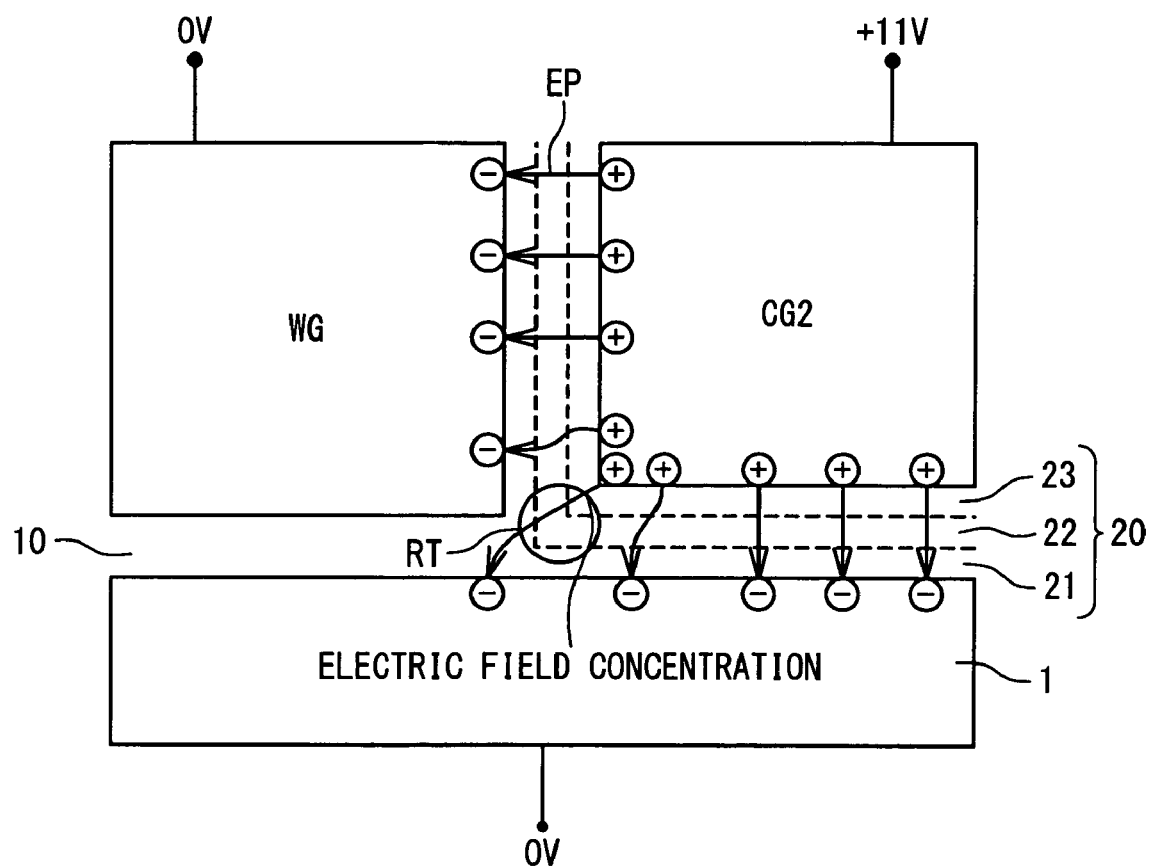
FIG. 8 is a schematic diagram for describing electric field concentration at the time of the electron ejection.

FIG. 8 schematically shows a state of the electric field at this time. As described above, the voltage of 0 V is applied to the word gate WG and the semiconductor substrate 1, while the voltage of +11 V is applied to the control gate CG2. As in the case of the electron injection, this state is approximately equal to the L-shaped capacitor. Note that, however, the charge polarities and the electric field direction are opposite to those in the case of the electron injection (refer to FIG. 4). In FIG. 8, positive charges appear on the surface of the control gate CG2, while negative charges appear on the surfaces of the word gate WG and the semiconductor substrate 1. In this case, a "program electric field EP" directed from the surface of the control gate CG2 toward the surfaces of the word gate WG and the semiconductor substrate 1 is generated.

As in the case of the electron injection, the "electric field concentration" is generated on the side of the control gate CG2, namely, in and around the top insulating film 23 in the trap region RT. Conversely, the "electric field relaxation" is generated on the side of the semiconductor substrate 1, namely, in and around the bottom insulating film 21 in the trap region RT. The program electric field EP becomes stronger in and around the top insulating film 23 in the trap region RT while becomes weaker in and around the bottom insulating film 21 in the trap region RT.

Consequently, as shown in FIG. 7, electrons are ejected from the charge trapping film 22 to the control gate CG2 through the top insulating film (tunnel insulating film) 23 due to the FN tunneling. In particular, due to the electric field concentration on the edge section CS of the control gate CG2, electrons are intensively ejected to near the edge section CS. This means that a region into which electrons are injected and a region from which electrons are ejected almost overlap with each other, which is preferable from a viewpoint of programming/erasing efficiency.

Figure 9:
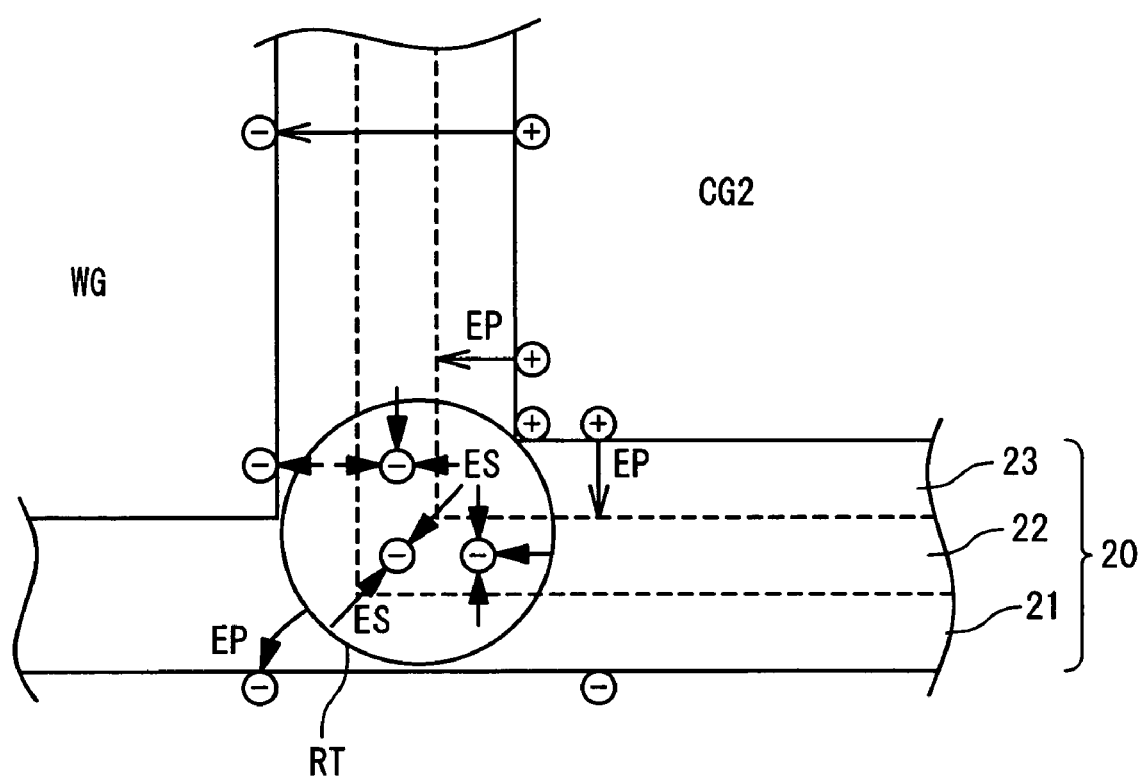
FIG. 9 is a schematic diagram for describing an action of a self electric field at the time of the electron ejection.

FIG. 9 shows a state before electrons are ejected from the charge trapping film 22. As a result of the foregoing electron injection, an electron group is concentratively trapped in the charge trapping film 22 within the trap region RT. As described above, the self electric field ES is generated from the trapped electron group. In the case of the electron ejection, the self electric field ES works so as to strengthen the program electric field EP on the side of the top insulating film 23 and weaken the program electric field EP on the side of the bottom insulating film 21. In other words, the electric field concentration and electric field relaxation both are further enhanced (promoted) by superposition of the program electric field EP and the self electric field ES. This means that an efficiency of the electron ejection is further improved.

According to the present embodiment, as described above, the electric field concentration on the edge section CS of the control gate CG2 is generated and thus electrons are ejected from the charge trapping film 22 to the control gate CG2 through the top insulating film 23. In the case of the FN tunneling by the use of the electric field concentration, an efficiency of the electron ejection is improved as compared with the conventional FN tunneling. Therefore, the applied voltage can be designed to be smaller. To put it the other way around, the electron ejection can be well achieved due to the electric field concentration, even if the applied voltage is set to be comparatively small. When the applied voltage is reduced, the breakdown voltage required for the memory cell transistor also becomes smaller, which can reduce the element size. In other words, the increase in the element size is suppressed although the FN tunneling method is adopted according to the present embodiment.

(Experiment)

Figure 10A:
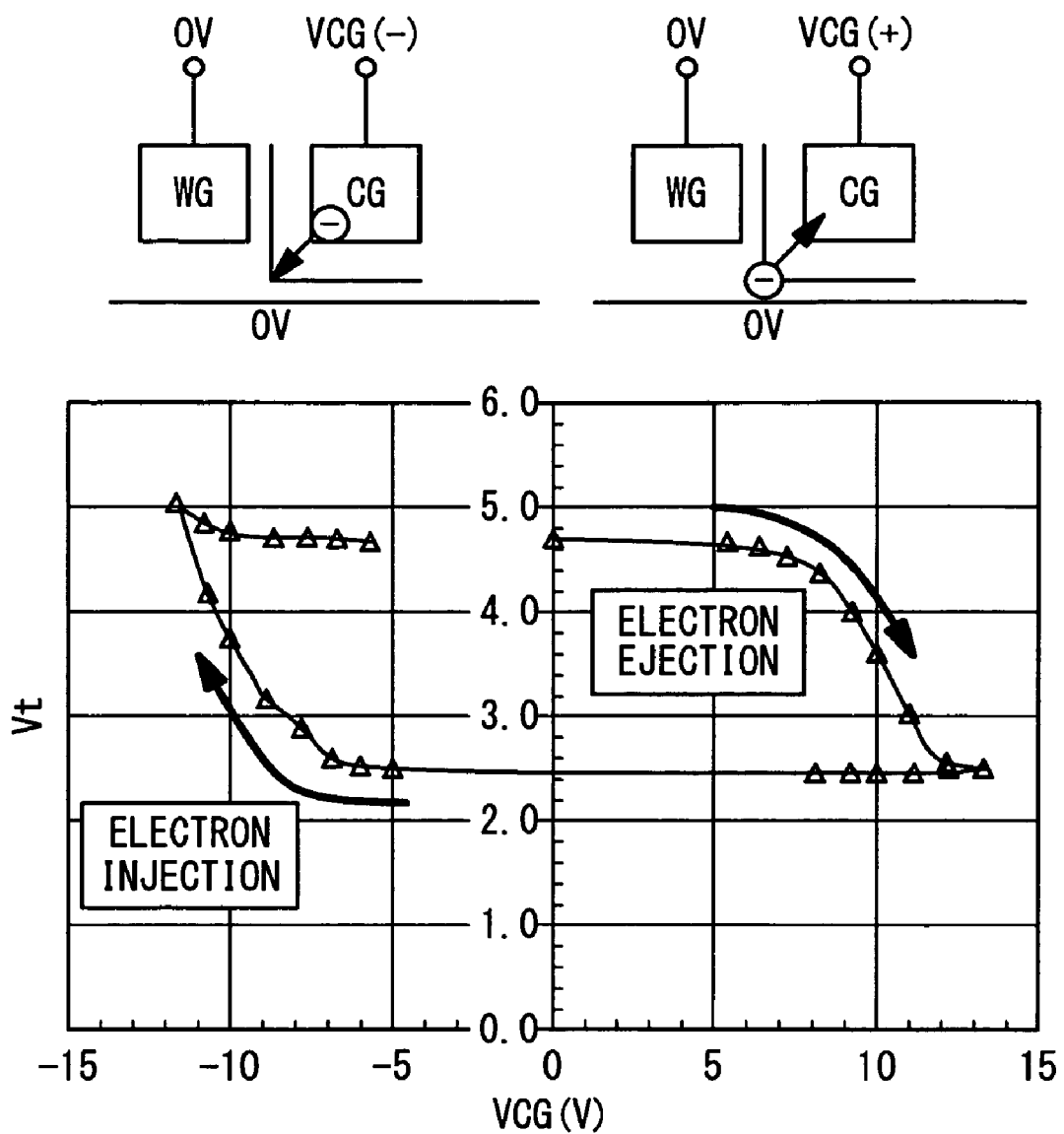
FIG. 10A is a graph showing change in a threshold voltage Vt in response to a voltage VCG applied to a control gate.
Figure 10B:
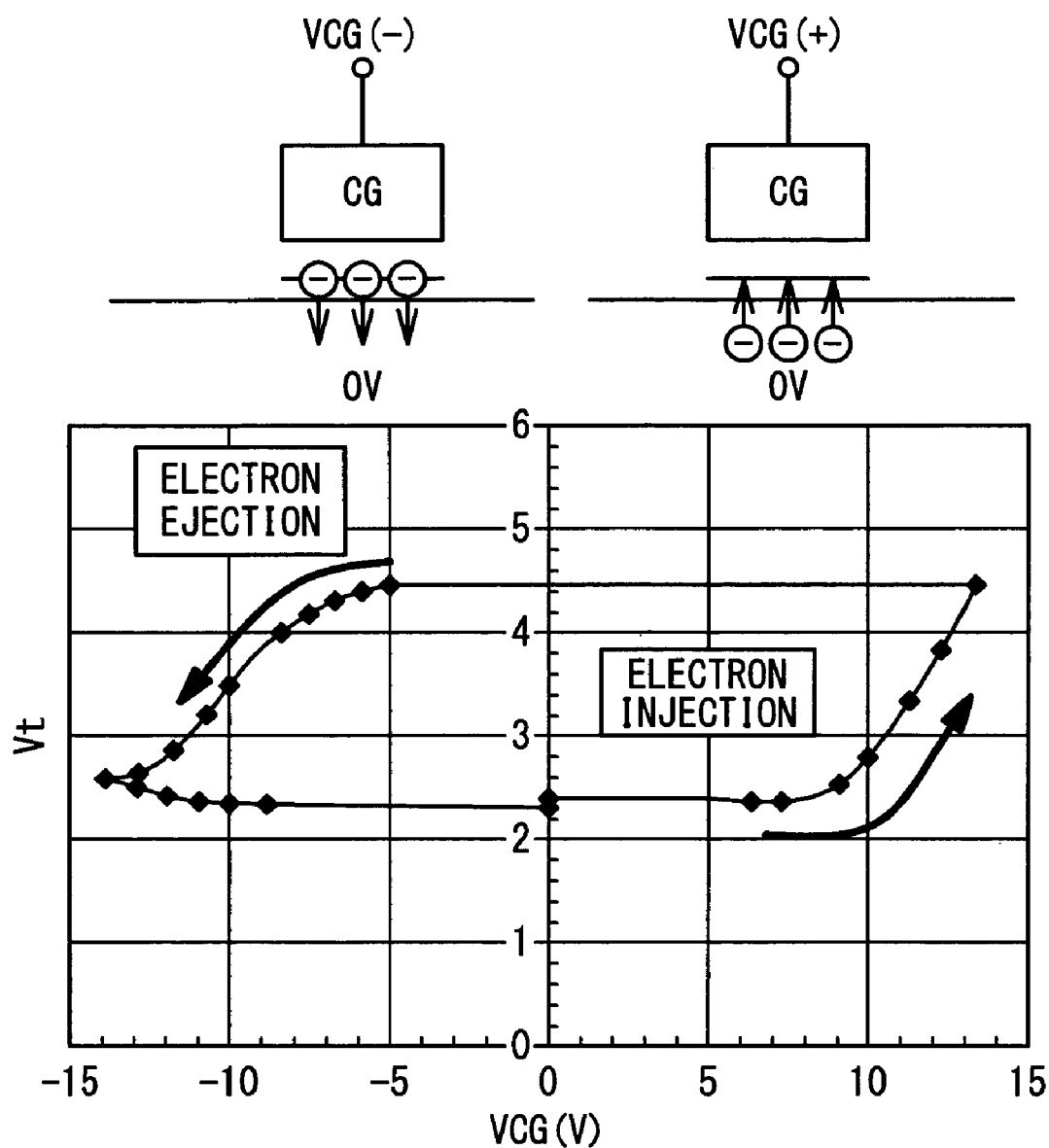
FIG. 10B is a graph showing change in a threshold voltage Vt in a case of a comparative example.

Next, the charge transfer between the control gate CG and the charge trapping film 22 will be verified based on results of experiments conducted by the inventor of the present application. FIGS. 10A and 10B show change in the threshold voltage Vt in response to the gate voltage VCG applied to the control gate CG. The abscissa axis represents the gate voltage VCG applied to the control gate. Here, a 100 msec pulse voltage is applied to the control gate. The longitudinal axis represents the threshold voltage Vt.

FIG. 10A shows a case of the present embodiment. On the other hand, FIG. 10B shows a case of a planar-type where no word gate WG exists, as a comparative example. Also in the case of the comparative example, an ONO film is formed between the control gate CG and the substrate. That is, the comparative example is the same as the present embodiment, except that no word gate WG exists. Each film thickness of the ONO film is the same between the present embodiment and the comparative example. In both of the present embodiment and the comparative example, the top insulating film 23 is formed to be thicker than the bottom insulating film 21.

First, the case of the comparative example will be described with reference to FIG. 10B. It can be seen from FIG. 10B that the threshold voltage Vt increases when the gate voltage VCG is a positive voltage higher than the substrate voltage (=0 V). This means that electrons are injected into the charge trapping film. In this case where the gate voltage VCG is positive, an electric field directed from the control gate toward the substrate is generated. Therefore, if electron injection occurs, it is the electron injection from the side of the substrate. On the other hand, it can be seen that the threshold voltage Vt decreases when the gate voltage VCG is a negative voltage lower than the substrate voltage. This means that electrons trapped by the charge trapping film are ejected. In this case where the gate voltage VCG is negative, an electric field directed from the substrate toward the control gate is generated. Therefore, if electron ejection occurs, it is the electron ejection to the side of the substrate. In this manner, the charge transfer occurs between the substrate and the charge trapping film in the case of the comparative example.

Next, the case of the present embodiment will be described with reference to FIG. 10A. It can be seen from FIG. 10A that the threshold voltage Vt increases when the gate voltage VCG is a negative voltage lower than the substrate voltage (=0 V). This means that electrons are injected into the charge trapping film. In this case where the gate voltage VCG is negative, an electric field directed from the substrate toward the control gate is generated. Therefore, if electron injection occurs, it is the electron injection from the side of the control gate. On the other hand, it can be seen that the threshold voltage Vt decreases when the gate voltage VCG is a positive voltage higher than the substrate voltage. This means that electrons trapped by the charge trapping film are ejected. In this case where the gate voltage VCG is positive, an electric field directed from the control gate toward the substrate is generated. Therefore, if electron ejection occurs, it is the electron ejection to the side of the control gate. In this manner, the charge transfer occurs between the control gate and the charge trapping film in the case of the present embodiment.

In both the examples shown in FIGS. 10A and 10B, the top insulating film 23 is thicker than the bottom insulating film 21. In general, the FN tunneling is more likely to occur as the film thickness is smaller. Therefore, if an applied electric field is the same, the FN tunneling mainly occurs not through the thicker top insulating film 23 but through the thinner bottom insulating film 21 on the substrate side. However, according to the present embodiment, asymmetry of an electric field distribution is generated due to the electric field concentration and electric field relaxation. On the side of the top insulating film 23, the electric field concentration is generated and hence the applied electric field becomes very strong. Conversely, on the side of the bottom insulating film 21, the electric field relaxation is generated and hence the applied electric field becomes very weak. Consequently, the FN tunneling is considered to occur through the top insulating film 23 in spite that the top insulating film 23 is thicker than the bottom insulating film 21.

1-4. Circuit Configuration

FIG. 11 is a block diagram showing an example of a semiconductor integrated circuit 100 provided with the nonvolatile semiconductor memory according to the present embodiment. The semiconductor integrated circuit 100 is provided with a memory cell array 110, a drive circuit 120 and a charge pump 130. The memory cell array 110 includes a plurality of memory cells MC arranged in an array. Each of the plurality of memory cells MC has the memory cell transistor shown in FIG. 1.

The drive circuit 120 generates the voltages VWG, VCG1, VCG2, VSD and VSUB by using a voltage generated by the charge pump 130. The voltages VWG, VCG1, VCG2, VSD and VSUB are voltages applied to the word gate WG, the control gates CG1, CG2, the diffusion regions 5 and the semiconductor substrate 1 in the memory cell array 110, respectively. Furthermore, the drive circuit 120 selects a memory cell MC as a program target or an erasure target from the plurality of memory cells MC. The selected memory cell MC is hereinafter referred to as a "selected memory cell SMC". In the present embodiment, one memory cell MC includes two bits and the selected memory cell SMC can include both a selected bit and an unselected bit (refer to FIGS. 3 and 7). The drive circuit 120 controls the voltages VWG, VCG1, VCG2, VSD and VSUB applied to the memory cell array 110 such that the electron injection or the electron ejection occurs only in the selected bit of the selected memory cell SMC.

Figure 12:
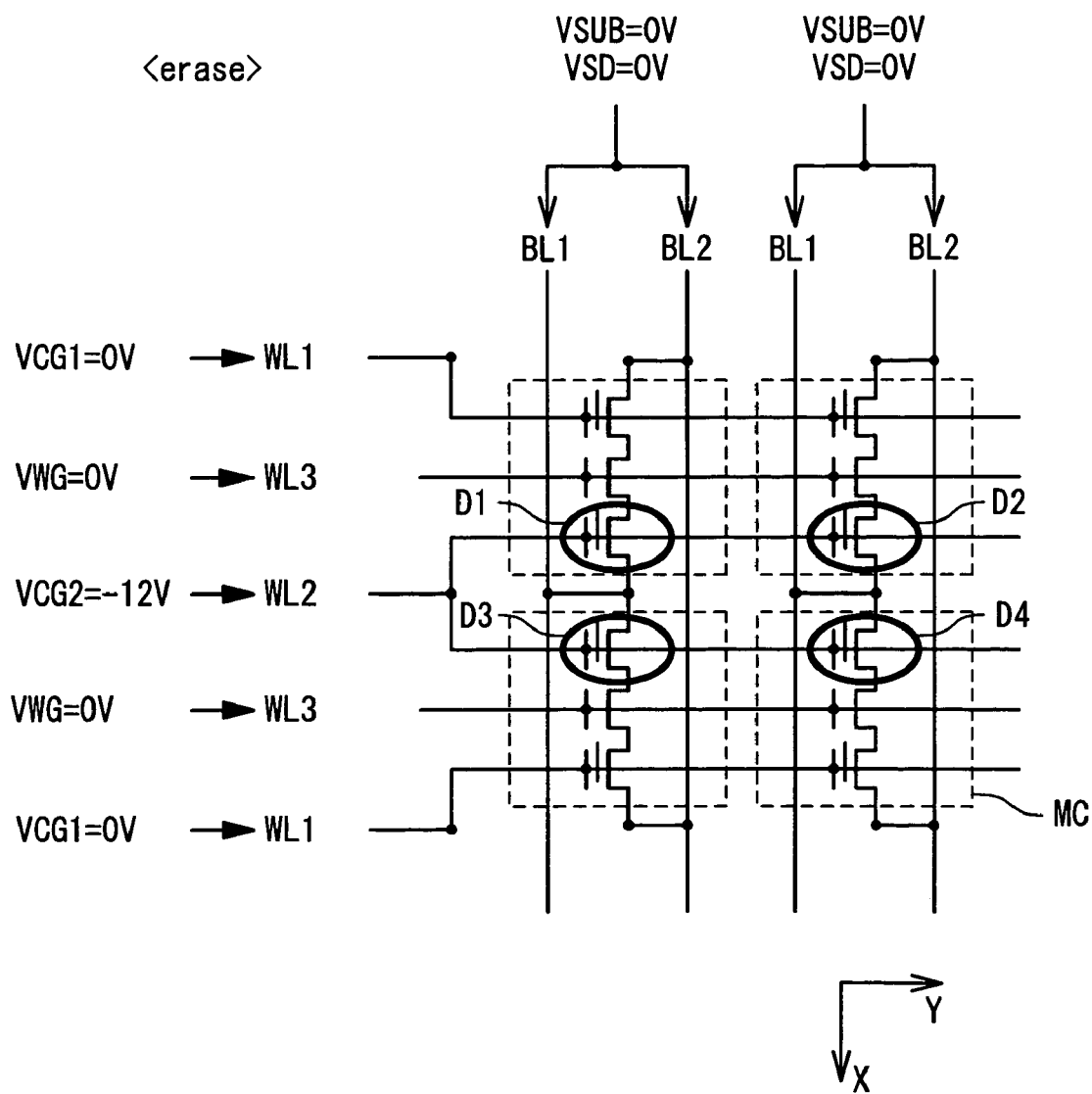
FIG. 12 is a circuit diagram for describing an erase operation of the nonvolatile semiconductor memory.

FIG. 12 shows a configuration example of the memory cell array 110. Each of word lines WL1, WL2 and WL3 extends in the Y-direction and is connected in common to memory cells MC aligned in the Y-direction. The word lines WL1, WL2 and WL3 are connected to the control gate CG1, the control gate CG2 and the word gate WG, respectively. Also, two word lines WL2 respectively connected to two adjacent memory cells MC in the X-direction are connected with each other. Each of bit lines BL1 and BL2 extends in the X-direction and is connected in common to memory cells MC aligned in the X-direction. The bit line BL1 is connected to the diffusion regions 5b on the side of the control gate CG2, and the bit line BL2 is connected to the diffusion regions 5a on the side of the control gate CG1. The voltages VCG1, VCG2, VWG and VSD are applied through the word lines WL1, WL2, WL3 and the bit lines (BL1, BL2), respectively.

FIGS. 12 also shows an example of the voltages supplied to the memory cell array 110 at the time of data erasing. In the example shown in FIG. 12, four memory cells MC all are the selected memory cells SMC, and data of selected bits D1 to D4 included in the respective selected memory cells SMC are erased collectively. To this end, the gate voltage VCG2 of −12 V is applied to the word line WL2 connected to the control gates CG2 of the selected memory cells SMC. The other voltages VWG, VCG1, VSD and VSUB are 0V (refer to FIG. 3). Consequently, the data of the selected bits D1 to D4 are erased collectively.

It should be noted that both of the two bits included in one selected memory cell SMC may be selected bits. In this case, not only the gate voltage VCG2 but also the gate voltage VCG1 is set to −12 V. As a result, data of all bits are collectively erased.

Figure 13:
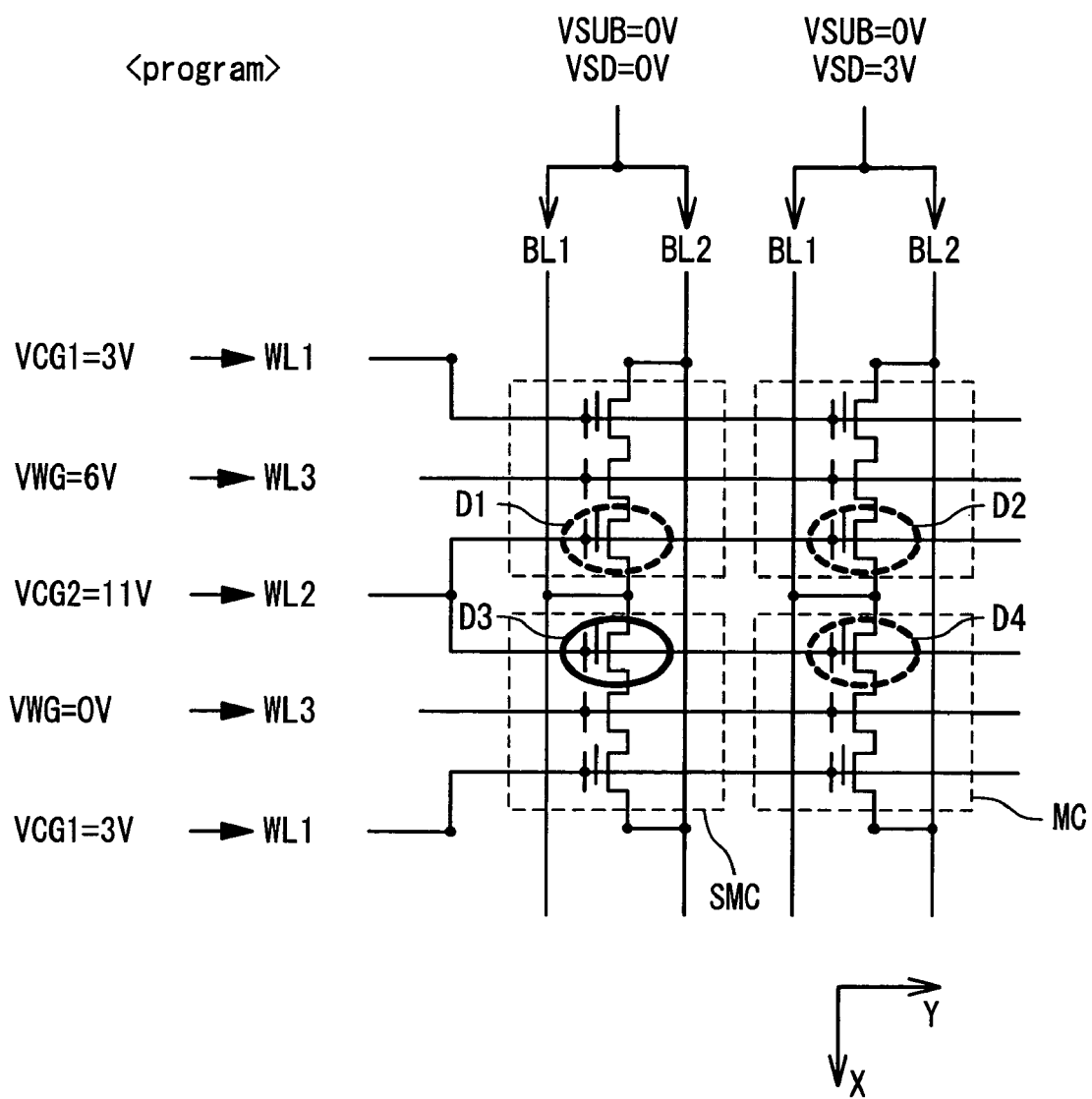
FIG. 13 is a circuit diagram for describing a program operation of the nonvolatile semiconductor memory.

FIG. 13 shows an example of the voltages supplied to the memory cell array 110 at the time of data programming. The data programming is performed with respect to one bit. For example, let us consider a case where the data programming is performed with respect to the bit D3. In this case, the bit D3 is the selected bit and a memory cell MC including the bit D3 is the selected memory cell SMC.

As to the selected memory cell SMC, the voltages VWG, VCG1, VCG2, VSD and VSUB are set to 0 V, 3 V, 11 V, 0 V and 0 V, respectively (refer to FIG. 7). The gate voltage VWG of 0 V is applied to the word line WL3 connected to the selected memory cell SMC. The gate voltage VCG1 of 3 V is applied to the word line WL1 connected to the selected memory cell SMC. The gate voltage VCG2 of 11 V is applied to the word line WL2 connected to the selected memory cell SMC. The voltage VSD of 0 V is applied to the bit lines BL1 and BL2 connected to the selected memory cell SMC. As a result, data is programmed to the selected bit D3.

Note here that the word line WL2 connected to the selected memory cell SMC is also connected to unselected memory cells MC other than the selected memory cell SMC, as shown in FIG. 13. That is to say, the gate voltage VCG2 of 11 V is applied also to unselected bits D1, D2 and D4 included in the unselected memory cells MC. In order to prevent programming to the unselected bits D1, D2 and D4, the following control is performed.

A voltage between 0 V and 11 V is applied to the word line WL3, bit lines BL1 and BL2 which are not connected to the selected memory cell SMC. For example, a gate voltage VWG of 6 V is applied to the word line WL3 which is not connected to the selected memory cell SMC. A voltage VSD of 3 V is applied to the bit lines BL1 and BL2 which are not connected to the selected memory cell SMC. In this case, the strength of the program electric field EP generated in the unselected bits D1, D2 and D4 becomes insufficient for the occurrence of FN tunneling. Consequently, programming to the unselected bits D1, D2 and D4 is inhibited.

1-5. Effects

Some effects obtained by the present embodiment are as follows.

According to the present embodiment, the CHE method is not adopted for the electron injection. Instead, the FN tunneling method is adopted for at least the electron injection. Therefore, the current consumption is reduced as compared with the case where the CHE method is used.

The reduction in the current consumption leads to reduction in an area of the charge pump 130 shown in FIG. 11. In the case of the FN tunneling method, an absolute value of the required voltage is comparatively large and it is thus necessary to increase the number of serial stages of charge pumps. In the case of the CHE method, on the other hand, an amount of the required current is comparatively large although an absolute value of the required voltage is comparatively small. It is therefore necessary to increase capacity (the amount of current) by adding charge pumps in parallel, although the number of serial stages of charge pumps can be small. Here, the required current is several tens pA (picoampere) in the case of the FN tunneling method while several hundreds μA (microampere) in the case of the CHE method, and the current ratio is as large as about $10^7$. Meanwhile, the required voltage is 5 to 10 V in the case of the CHE method while 10 V or more in the case of the FN tunneling method, and the voltage ratio is 2 to 3 at most. That is to say, the current ratio is incomparably larger than the voltage ratio. Although the required voltage is larger in the case of the FN tunneling method, the accompanying increase in the area of the charge pump is much smaller than the case of the CHE method where a large amount of current is required. Therefore, the FN tunneling method is preferable from a viewpoint of the area of the charge pump 130.

Moreover, according to the present embodiment, the FN tunneling occurs between the control gate CG and the charge trapping film 23 due to the electric field concentration on the side of the control gate CG. In the case of the FN tunneling by the use of the electric field concentration, efficiencies of the electron injection and electron ejection are improved as compared with the conventional FN tunneling. Therefore, the applied voltage can be designed to be smaller. To put it the other way around, the electron injection and electron ejection can be well achieved even if the applied voltage is set to be comparatively small, because the electric field concentration is generated. When the applied voltage is reduced, the breakdown voltage required for the memory cell transistor also becomes smaller, which can reduce the element size.

As described above, according to the present embodiment, the increase in the element size is suppressed although the FN tunneling method is adopted. That is, it is possible to reduce the current consumption with suppressing the increase in the element size.

Also, the improvement in the efficiencies of the electron injection and electron ejection due to the electric field concentration means that program/erase speed is improved. Furthermore, in the programming/erasing, the electric field concentration occurs mainly on the edge section CS of the control gate CG. As a result, electrons are intensively injected into the trap region RT facing the edge section CS and intensively ejected from the same trap region RT. In other words, the electron ejection site coincides with the electron injection site. This also contributes to improvement in the program/erase speed.

By way of comparison, let us consider a case where the electron injection is performed by the CHE method and the electron ejection is performed by the conventional FN tunneling method. According to the CHE method, electrons are injected to a region in the charge trapping film near the drain dominantly. On the other hand, according to the conventional FN tunneling method, electrons are ejected through the whole of the tunnel insulating film. That is to say, the electron ejection site does not so much coincide with the electron injection site. Therefore, especially the electron ejection becomes inefficient and thus an operation speed cannot be improved.

Figure 14:
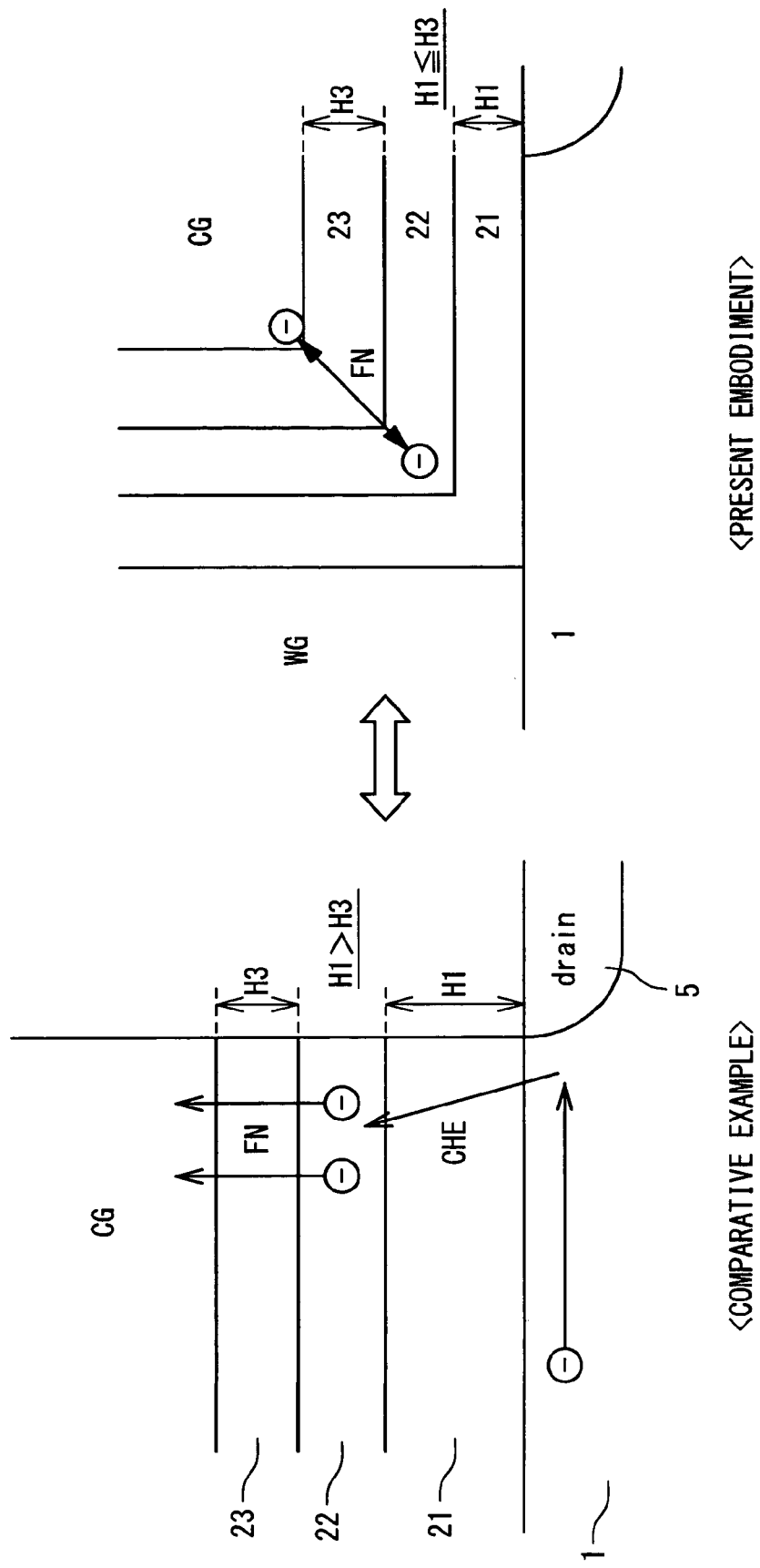
FIG. 14 is a schematic diagram showing comparison of a second gate insulating film between the present embodiment and the comparative example.

Furthermore, according to the present embodiment, restriction on the structure of the second gate insulating film 20 between the semiconductor substrate 1 and the control gate CG is loosened. This will be described below with reference to FIG. 14. The second gate insulating film 20 includes the bottom insulating film (substrate-side insulating film) 21, the charge trapping film 22 and the top insulating film (tunnel insulating film) 23. A film thickness of the bottom insulating film 21 is H1, and a film thickness of the top insulating film 23 is H3.

First, let us consider a technique described in the above-mentioned Patent Document 4 (Japanese Laid Open Patent Application JP-2001-102466) as a comparative example. According to the comparative example, electrons trapped by the charge trapping film 22 are ejected to the control gate CG by the FN tunneling method. More specifically, a positive voltage is applied to the control gate CG, and thereby electrons are ejected to the control gate CG through the top insulating film 23. Here, if the film thickness H1 of the bottom insulating film 21 is small, electrons are injected into the charge trapping film 22 from the substrate side through the bottom insulating film 21 concurrently with the electron ejection. When the amount of the electron injection becomes larger than the amount of the electron ejection, practically no electrons are ejected from the charge trapping film 22.

In order to realize practical electron ejection, probability of the FN tunneling through the top insulating film 23 needs to be higher than that through the bottom insulating film 21. Therefore, the film thickness H3 of the top insulating film 23 needs to be smaller than the film thickness H1 of the bottom insulating film 21. That is to say, restriction "H1>H3" is required for the second gate insulating film 20. Even if the FN tunneling through the bottom insulating film 21 hardly occurs, it does not matter because the electron injection is performed based on the CHE method according to the comparative example.

In this manner, it is necessary in the comparative example to make the film thickness H3 of the top insulating film 23 small in order to achieve the FN tunneling through the top insulating film 23. In this case, however, a retention characteristic for electrons in the charge trapping film 22 is deteriorated because the top insulating film 23 is thin. In other words, a data retention characteristic is deteriorated. In order to ensure the data retention characteristic to some extent, the top insulating film 23 may be formed thicker. In this case, the film thickness H1 of the bottom insulating film 21 needs to be further increased due to the above-mentioned restriction "H1>H3".

According to the present embodiment, the "electric field concentration" and "electric field relaxation" are generated as described above. More specifically, the electric field concentration occurs on the side of the top insulating film 23 and hence the applied electric field becomes very strong. Conversely, the electric field relaxation occurs on the side of the bottom insulating film 21 and hence the applied electric field becomes very weak. Consequently, the FN tunneling is likely to occur through the top insulating film 23 and is difficult to occur through the bottom insulating film 21, irrespective of a relation between the film thicknesses H1 and H3.

For example, let us consider a case where the film thicknesses H1 and H3 are the same (H1=H3). Even in this case, the FN tunneling through the top insulating film 23 can be achieved due to the asymmetry of the electric field applied to the top insulating film 23 and the bottom insulating film 21. Even when the top insulating film 23 is thicker than the bottom insulating film 21 (H3>H1), the electron injection and electron ejection through the top insulating film 23 can be substantially realized, which is as demonstrated in FIG. 10A.

As described above, the restriction "H1>H3" is not required in the present embodiment. Even when the thickness H1 is equal to or smaller than the thickness H3, the FN tunneling through the top insulating film 23 can be achieved. It is not necessary to make the top insulating film 23 thin in order to realize the FN tunneling through the top insulating film 23. It is therefore possible to freely design the thickness H3 of the top insulating film 23 such that a desired retention characteristic can be obtained. In other words, it is not necessary to give up the retention characteristic for the sake of the FN tunneling, and thus the retention characteristic can be improved. Moreover, it is also possible to freely design the thickness H1 of the bottom insulating film 21, without depending on the thickness H3 of the top insulating film 23. For example, the bottom insulating film 21 can be made thin to an extent that the desired retention characteristic can be obtained.

2. Second Embodiment

FIG. 15 is a cross-sectional view showing a structure of a nonvolatile semiconductor memory according to a second embodiment. An overlapping description with the first embodiment will be omitted as appropriate.

In the second embodiment, the side surfaces of the word gate WG and the control gate CG are formed in a tapered shape. More specifically, an angle θ of the edge section CS of the control gate CG can be defined in the YZ-plane, as shown in FIG. 15. The angle θ can also be defined as an angle between a bottom surface of the control gate CG and a side surface of the control gate CG facing the word gate WG. The angle θ has been about 90 degrees in the first embodiment. In the second embodiment, the angle θ is less than 90 degrees. As the angle θ becomes smaller, the electric field becomes more and more convergent to the edge section CS, namely, the electric field concentration is further intensified. From a viewpoint of the electric field concentration, it is preferable that that the angle θ does not exceed 90 degrees and is equal to or less than 90 degrees.

An example of a manufacturing process of the structure shown in FIG. 15 will be described with reference to FIGS. 16A to 16E. FIGS. 16A to 16E correspond to FIGS. 2A to 2E in the first embodiment, respectively, and an overlapping description with the first embodiment will be omitted.

Figure 16A:
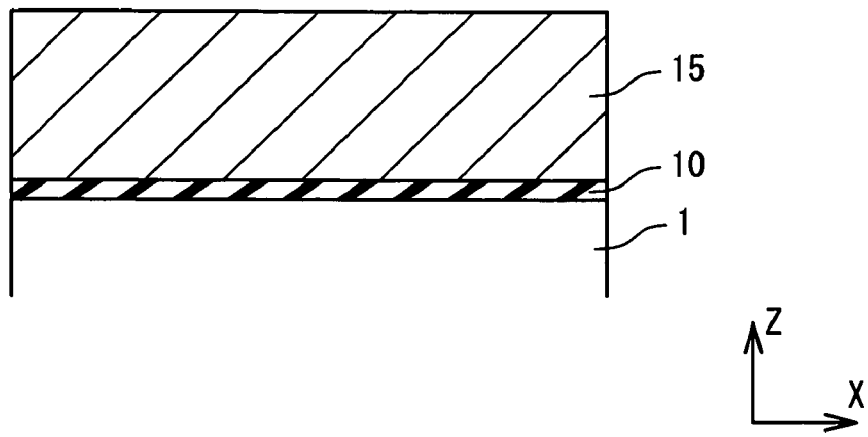
FIG. 16A is a cross-sectional view showing a manufacturing process of the structure shown in FIG. 15.
Figure 16B:
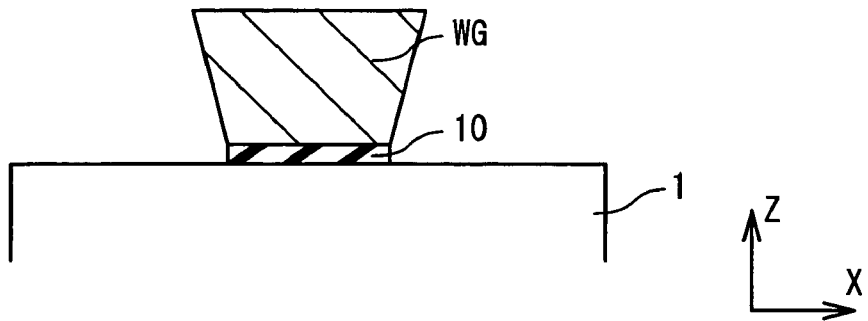
FIG. 16B is a cross-sectional view showing the manufacturing process of the structure shown in FIG. 15.

As shown in FIG. 16A, the first gate insulating film 10 is formed on the semiconductor substrate 1 and further the first polysilicon film 15 is deposited thereon. Next, as shown in FIG. 16B, the first polysilicon film 15 is etched. At this time, the etching process proceeds while inactive chemicals are reattached to a side wall formed by the etching. Usually, an etching condition is controlled such that the etching rate and the reattaching rate become substantially equal to each other. As a result, the obtained etching surface becomes substantially vertical. However, if the etching rate is higher than the reattaching rate, the etching surface gradually shifts inward. By utilizing this effect, a tapered shape shown in FIG. 16B can be formed. That is to say, the word gate WG shown in FIG. 16B can be formed by controlling the etching condition such that the etching rate becomes higher than the reattaching rate.

Figure 16C:
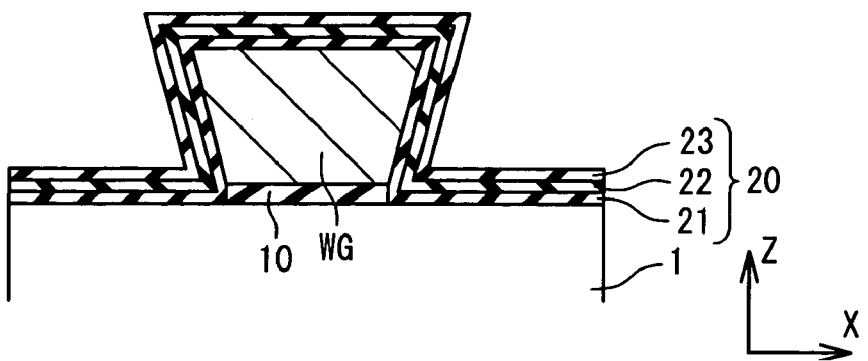
FIG. 16C is a cross-sectional view showing the manufacturing process of the structure shown in FIG. 15.
Figure 16D:
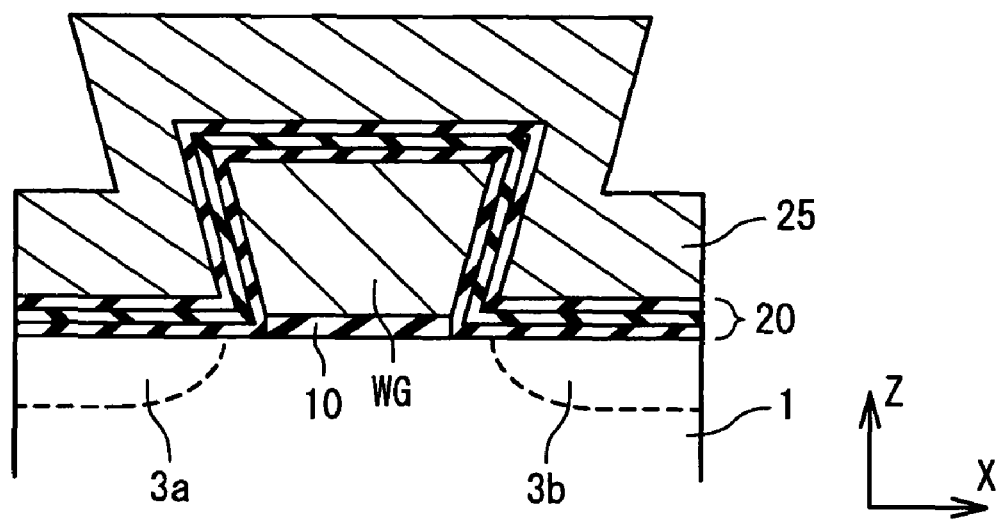
FIG. 16D is a cross-sectional view showing the manufacturing process of the structure shown in FIG. 15.
Figure 16E:
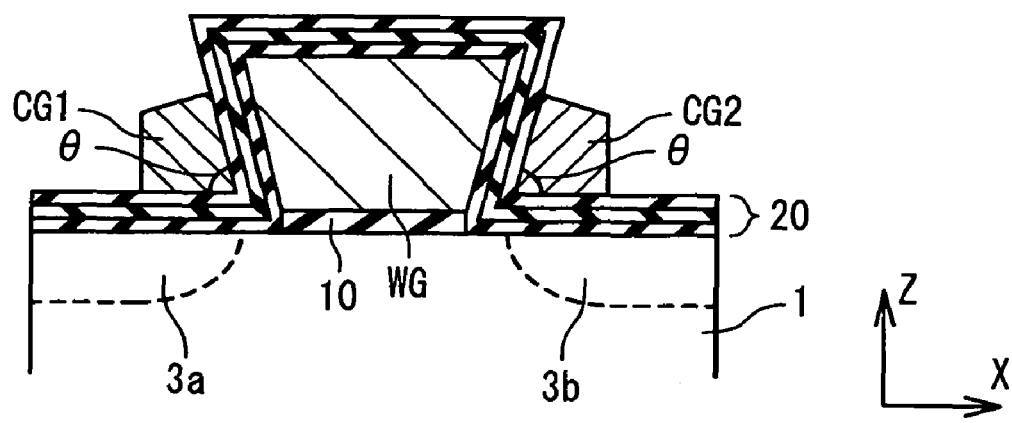
FIG. 16E is a cross-sectional view showing the manufacturing process of the structure shown in FIG. 15.

Next, as shown in FIG. 16C, the second gate insulating film 20 (the bottom insulating film 21, charge trapping film 22 and top insulating film 23) is formed. A side surface of the second gate insulating film 20 is also tapered. Next, as shown in FIG. 16D, the ion injection regions 3a and 3b are formed and the second polysilicon film 25 is blanket deposited. Subsequently, the second polysilicon film 25 is etched back. Consequently, as shown in FIG. 16E, the control gates CG1 and CG2 are formed on both sides of the word gate WG. The angle θ of the edge section of each of the control gates CG1 and CG2 is less than 90 degrees. The subsequent processes are the same as those in the first embodiment.

3. Third Embodiment

Figure 17:
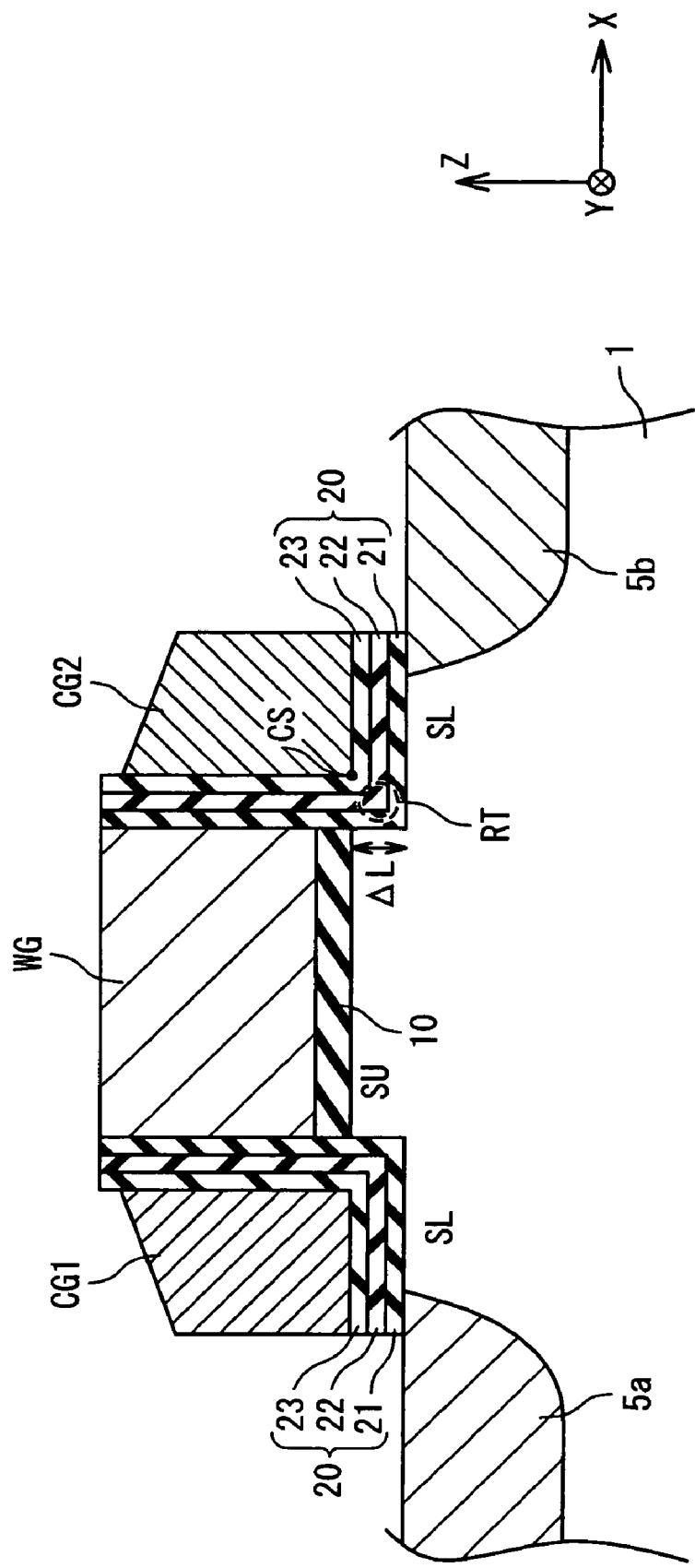
FIG. 17 is a cross-sectional view showing a structure of a nonvolatile semiconductor memory according to a third embodiment.

FIG. 17 is a cross-sectional view showing a structure of a nonvolatile semiconductor memory according to a third embodiment. An overlapping description with the first embodiment will be omitted as appropriate.

In the third embodiment, a step is formed on the surface of the semiconductor substrate 1. In other words, the surface of the semiconductor substrate 1 has an upper stage SU and a lower stage SL which form the step. The word gate WG is formed on the upper stage SU through the first gate insulating film 10. On the other hand, the control gate CG is formed on the lower stage SL through the second gate insulating film 20. As a result, a channel length around the trap region RT trapping electrons increases by ΔL as compared with the first embodiment. Since the channel length around the trap region RT increases, an OFF current of the memory cell transistor is further reduced. That is, an effect that the OFF current is further reduced can be obtained in addition to the effects obtained in the first embodiment.

Figure 18A:
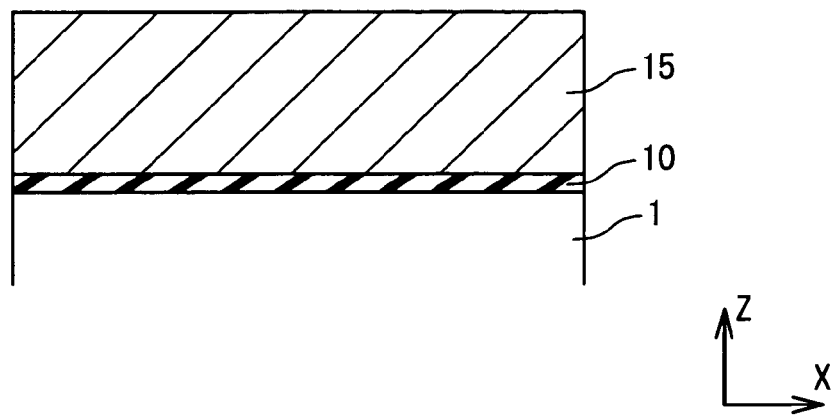
FIG. 18A is a cross-sectional view showing a manufacturing process of the structure shown in FIG. 17.
Figure 18B:
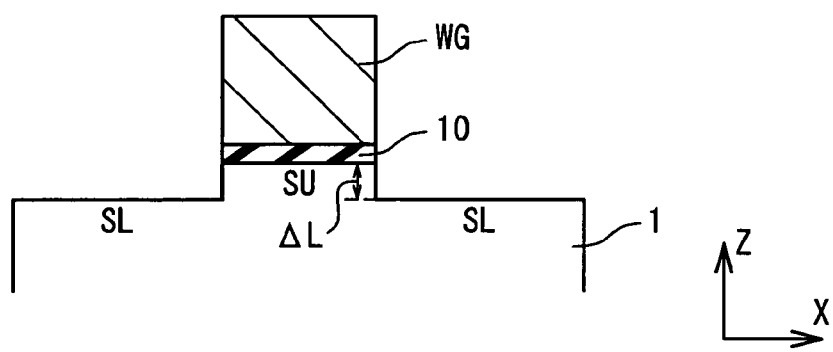
FIG. 18B is a cross-sectional view showing the manufacturing process of the structure shown in FIG. 17.
Figure 18C:
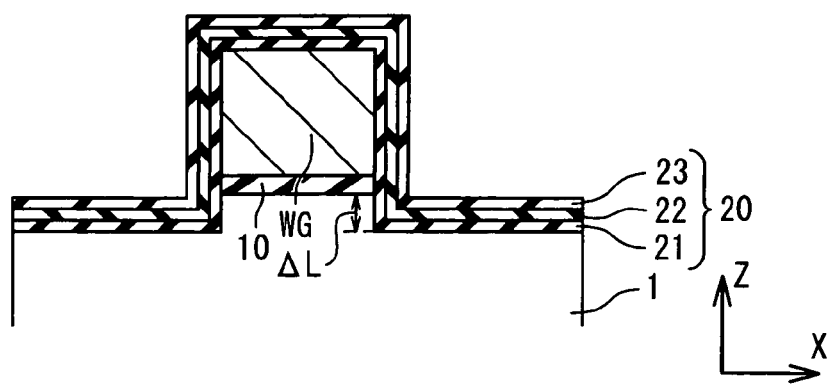
FIG. 18C is a cross-sectional view showing the manufacturing process of the structure shown in FIG. 17.

An example of a manufacturing process of the structure shown in FIG. 17 will be described with reference to FIGS. 18A to 18C. FIGS. 18A to 18C correspond to FIGS. 2A to 2C in the first embodiment, respectively, and an overlapping description with the first embodiment will be omitted.

As shown in FIG. 18A, the first gate insulating film 10 is formed on the semiconductor substrate 1 and further the first polysilicon film 15 is deposited thereon. Subsequently, a resist mask is formed on a region where the word gate WG is to be formed. By using the resist mask, a part of the semiconductor substrate 1 as well as the first polysilicon film 15 and the first gate insulating film 10 is etched. As a result, as shown in FIG. 18B, the upper stage SU and the lower stage SL are formed on the surface of the semiconductor substrate 1. The word gate WG is formed on the upper stage SU through the first gate insulating film 10. Subsequently, as shown in FIG. 18C, the second gate insulating film 20 (the bottom insulating film 21, charge trapping film 22 and top insulating film 23) are formed. The subsequent processes are the same as those in the first embodiment.

4. Fourth Embodiment

In the foregoing embodiments, a configuration in which one memory cell transistor stores 2-bit data is described. As a matter of course, a configuration in which one memory cell transistor stores 1-bit data is also possible. FIG. 19 is a cross-sectional view showing a structure of a nonvolatile semiconductor memory according to a fourth embodiment. As shown in FIG. 19, only one control gate CG is formed on one side of the word gate WG. Accordingly, one memory cell transistor stores only 1-bit data. The fourth embodiment can be combined with the second embodiment or the third embodiment.

Figure 20A:
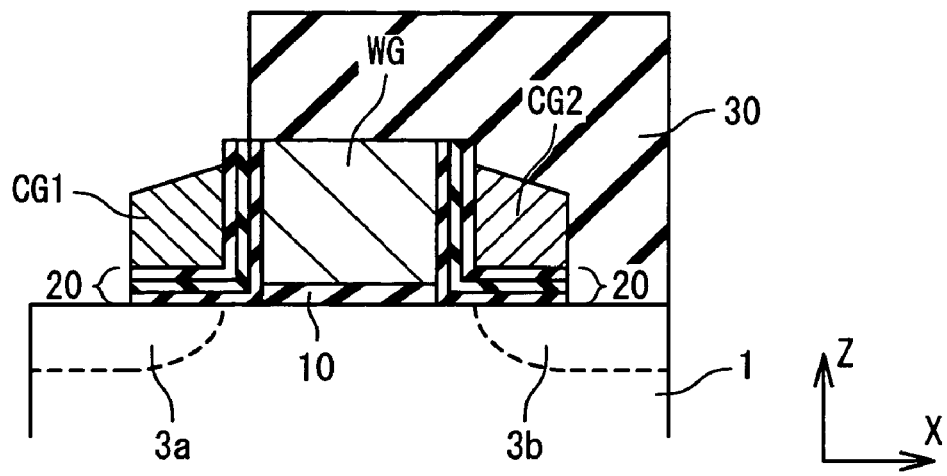
FIG. 20A is a cross-sectional view showing a manufacturing process of the structure shown in FIG. 19.
Figure 20B:
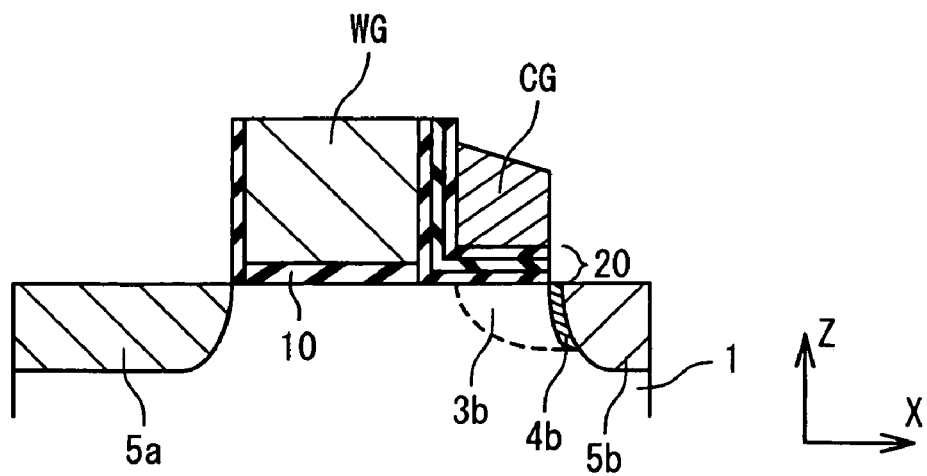
FIG. 20B is a cross-sectional view showing the manufacturing process of the structure shown in FIG. 19.

A manufacturing method of the structure shown in FIG. 19 is approximately the same as that in the first embodiment. However, a process of removing one control gate is added. Specifically, starting from the state shown in FIG. 2F, a mask 30 covering the control gate CG2 and the word gate WG is formed as shown in FIG. 20A. Then, the control gate CG1 is removed by etching using the mask 30. After that, an ion injection process is performed and the diffusion regions 5a and 5b are formed near the surface of the semiconductor substrate 1 as shown in FIG. 20B.

5. Fifth Embodiment

In Japanese Patent Application No. JP-2006-039778, the applicant of the present invention suggested a charge trapping memory formed in a trench of a semiconductor substrate. The present invention can also be applied to a structure disclosed in Japanese Patent Application No. JP-2006-039778. FIG. 21 shows an example of a charge trapping memory formed in a trench. The same reference numerals are given to the same components as those described in the first embodiment.

A plurality of trenches 40 are formed in parallel in the Y-direction in the semiconductor substrate 1. The surface of the semiconductor substrate 1 includes a surface of the trench 40. The word gate WG is formed on the surface of the trench 40 through a gate insulating film. The control gate CG (CG1, CG2) is formed on the surface of the trench 40 through a gate insulating film. The control gate CG is adjacent to the word gate WG through an insulating film. That is to say, the word gate WG and the control gate CG are close to each other but electrically isolated from each other.

In the example shown in FIG. 21, the second gate insulating film 20 is formed on the surface of the semiconductor substrate 1 which includes the surface of the trench 40. As in the foregoing embodiments, the second gate insulating film 20 includes the bottom insulating film (substrate-side insulating film) 21, the charge trapping film 22 and the top insulating film (tunnel insulating film) 23. The word gate WG and the control gate CG are both formed on the surface of the trench 40 through the second gate insulating film 20.

The control gates CG1 and CG2 are embedded in bottom regions of two adjacent trenches 40, respectively. On the other hand, the word gate WG is provided on the control gates CG1 and CG2. Insulating films 51 and 52 are formed between the word gate WG and the control gates CG1 and CG2, respectively. Moreover, the word gate WG is so formed as to cover between the adjacent trenches 40, and a part of the word gate WG falls into the trenches 40. That is, the word gate WG covers the substrate surface (including side walls of the trenches 40) between the control gates CG1 and CG2.

The diffusion regions 5a and 5b are formed in the semiconductor substrate 1 below bottom surfaces of the trenches 40. In other words, the diffusion regions 5a and 5b are formed in the semiconductor substrate 1 below the control gates CG1 and CG2, respectively. In this manner, the diffusion region 5a, the control gate CG1, the word gate WG, the control gate CG2 and the diffusion region 5b are provided in this order along the surface of the semiconductor substrate 1. Accordingly, a channel region is formed along the side surfaces of the trenches 40 and the substrate surface between the trenches 40.

Also in this structure, there is the trap region RT surrounded by the semiconductor substrate 1, the control gate CG and the word gate WG. The charge trapping film 22 is formed at least in the trap region RT. In the example shown in FIG. 21, the second gate insulating film 20 including the charge trapping film 22 extends from between the semiconductor substrate 1 and the control gate CG through the trap region RT to between the semiconductor substrate 1 and the word gate WG.

The data erasing and data programming can be achieved by the FN tunneling method as in the foregoing embodiments. More specifically, voltages similar to those in the foregoing embodiments are applied, and thereby the control gate CG, word gate WG and semiconductor substrate 1 as a whole form an approximate L-shaped capacitor. Consequently, the electric field concentration and electric field relaxation are generated in the trap region RT. In particular, the electric field concentration is generated in and around the tunnel insulating film 23 between the charge trapping film 22 in the trap region RT and the edge section CS of the control gate CG facing the trap region RT. Due to the electric field concentration, the electron injection and electron ejection are efficiently performed between the charge trapping film 22 and the control gate CG through the tunnel insulating film 23.

According to the fifth embodiment, the same effects as in the first embodiment can be obtained. Moreover, the side wall of the trench 40 generally has a tapered shape, and thus the angle θ of the edge section CS of the control gate CG tends to be less than 90 degrees as shown in FIG. 21. Therefore, the electric field concentration is enhanced, which is preferable.

It is apparent that the present invention is not limited to the above embodiments and may be modified and changed without departing from the scope and spirit of the invention.

What is claimed is:

1. A nonvolatile semiconductor memory, comprising:
a semiconductor substrate;
a first gate electrode formed on a surface of said semiconductor substrate through a first gate insulating film;
a second gate electrode formed on said surface of said semiconductor substrate through a second gate insulating film and being adjacent to said first gate electrode through an insulating film;
a charge trapping film as an insulating film trapping charges that are formed at least in a trap region surrounded by said semiconductor substrate, said first gate electrode, and said second gate electrode; and
a tunnel insulating film formed between said charge trapping film and said second gate electrode,
wherein in one of programming and erasing, electrons are injected into said charge trapping film from said second gate electrode through said tunnel insulating film by Fowler-Nordheim tunneling.

2. The nonvolatile semiconductor memory according to claim 1, wherein in another of programming and erasing, electrons are ejected from said charge trapping film to said second gate electrode through said tunnel insulating film by Fowler-Nordheim tunneling.

3. The nonvolatile semiconductor memory according to claim 2, wherein in programming and erasing, a first voltage is applied to said first gate electrode and said semiconductor substrate, and a second voltage different from said first voltage is applied to said second gate electrode.

4. The nonvolatile semiconductor memory according to claim 3, wherein said second voltage is lower than said first voltage when electrons are injected into said charge trapping film, and said second voltage is higher than said first voltage when electrons are ejected from said charge trapping film.

5. The nonvolatile semiconductor memory according to claim 1, wherein said second gate insulating film comprises:
    said tunnel insulating film;
    said charge trapping film; and
    a substrate-side insulating film formed between said charge trapping film and said semiconductor substrate,
    wherein said second gate insulating film is formed in said trap region and between said semiconductor substrate and said second gate electrode.

6. The nonvolatile semiconductor memory according to claim 5, wherein a thickness of said substrate-side insulating film is equal to or less than a thickness of said tunnel insulating film.

7. The nonvolatile semiconductor memory according to claim 5, wherein said second gate insulating film extends from between said semiconductor substrate and said second gate electrode through said trap region to between said first gate electrode and said second gate electrode.

8. The nonvolatile semiconductor memory according to claim 1, wherein a first plane is perpendicular to a direction in which said second gate electrode extends,
    wherein said second gate electrode has an edge section facing said trap region, and
    wherein an angle of said edge section in said first plane is equal to or less than 90 degrees.

9. The nonvolatile semiconductor memory according to claim 1, wherein said surface of said semiconductor substrate has an upper stage and a lower stage that form a step,
    wherein said first gate electrode is formed on said upper stage through said first gate insulating film, and
    wherein said second gate electrode is formed on said lower stage through said second gate insulating film.

10. The nonvolatile semiconductor memory according to claim 1, wherein said semiconductor substrate comprises a trench,
    wherein said first gate electrode is formed on a surface of said trench through said first gate insulating film, and
    wherein said second gate electrode is formed on said surface of said trench through said second gate insulating film.

11. The nonvolatile semiconductor memory according to claim 10, wherein said second gate insulating film includes said tunnel insulating film and said charge trapping film,
    wherein said first gate insulating film is same as said second gate insulating film, and
    wherein said second gate insulating film extends from between said semiconductor substrate and said second gate electrode through said trap region to between said semiconductor substrate and said first gate electrode.

12. A nonvolatile semiconductor memory, comprising:
    a semiconductor substrate;
    a first gate electrode formed on a surface of said semiconductor substrate through a first gate insulating film;
    a second gate electrode formed on said surface of said semiconductor substrate through a second gate insulating film and being adjacent to said first gate electrode through an insulating film; and
    a charge trapping film as an insulating film trapping charges that is formed at least in a trap region surrounded by said semiconductor substrate, said first gate electrod, and said second gate electrode,
    wherein said second gate electrode has an edge section facing said trap region, and
    wherein electrons are injected into said charge trapping film from said second gate electrode by electric field concentration on said edge section.

13. The nonvolatile semiconductor memory according to claim 12, wherein electrons are ejected from said charge trapping film to said second gate electrode by electric field concentration on said edge section.

14. A data programming/erasing method for a nonvolatile semiconductor memory, said nonvolatile semiconductor memory comprising:
    a first gate electrode formed on a surface of a semiconductor substrate through a first gate insulating film;
    a second gate electrode formed on said surface of said semiconductor substrate through a second gate insulating film and being adjacent to said first gate electrode through an insulating film;
    a charge trapping film as an insulating film trapping charges that is formed at least in a trap region surrounded by said semiconductor substrate, said first gate electrode, and said second gate electrode; and
    a tunnel insulating film formed between said charge trapping film and said second gate electrode,
    the data programming/erasing method comprising:
        injecting electrons into said charge trapping film from said second gate electrode through said tunnel insulating film by Fowler-Nordheim tunneling.

15. The data programming/erasing method according to claim 14, further comprising:
    ejecting electrons from said charge trapping film to said second gate electrode through said tunnel insulating film by Fowler-Nordheim tunneling.

16. The nonvolatile semiconductor memory according to claim 1, wherein said tunnel insulating film has a same length as that of the charge trapping film below the second gate electrode.

17. The nonvolatile semiconductor memory according to claim 1, wherein said second gate insulating film is formed on a side surface of said first gate insulating film.

18. The nonvolatile semiconductor memory according to claim 1, wherein an entirety of an upper surface of said charge trapping film contacts a lower surface of the tunnel insulating film.

19. The nonvolatile semiconductor memory according to claim 1, wherein said nonvolatile semiconductor memory further comprises a diffusion region formed below the tunnel insulating film in a direction in which said second gate electrode extends.

20. The nonvolatile semiconductor memory according to claim 12, wherein said electrons are injected into said charge trapping film from said second gate electrode through a tunnel insulating film formed on the charge trapping film, said tunnel insulating film having a same length as that of the charge trapping film below the second gate electrode.

* * * * *